United States Patent
Hatakeyama et al.

(10) Patent No.: US 7,154,586 B2
(45) Date of Patent: Dec. 26, 2006

(54) CATOPTRIC PROJECTION OPTICAL SYSTEM AND EXPOSURE APPARATUS HAVING THE SAME

(75) Inventors: Koshi Hatakeyama, Tochigi (JP); Toshihiro Sunaga, Tochigi (JP); Takahiro Sasaki, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 108 days.

(21) Appl. No.: 10/785,288

(22) Filed: Feb. 23, 2004

(65) Prior Publication Data

US 2004/0223130 A1   Nov. 11, 2004

(30) Foreign Application Priority Data

Feb. 21, 2003 (JP) ............................. 2003-044887
Feb. 21, 2003 (JP) ............................. 2003-044888
Feb. 21, 2003 (JP) ............................. 2003-044889

(51) Int. Cl.
  *G03B 27/54* (2006.01)
  *G03B 27/52* (2006.01)

(52) U.S. Cl. ............................. 355/67; 355/55

(58) Field of Classification Search .............. 355/67, 355/55; 359/359, 727, 859, 726
See application file for complete search history.

(56) References Cited

U.S. PATENT DOCUMENTS

| 6,033,079 A | 3/2000 | Hudyma et al. |
| 6,172,825 B1 * | 1/2001 | Takahashi ............... 359/859 |
| 6,922,291 B1 * | 7/2005 | Sunaga et al. ........... 359/726 |

FOREIGN PATENT DOCUMENTS

| JP | 2002-6221 | 1/2000 |
| JP | 2000-100694 | 4/2000 |
| JP | 2000-235144 | 8/2000 |
| WO | 02/056114 A2 | 4/2002 |

* cited by examiner

*Primary Examiner*—Peter B. Kim
(74) *Attorney, Agent, or Firm*—Morgan & Finnegan, LLP

(57) ABSTRACT

A catoptric projection optical system for projecting a reduced size of a pattern on an object surface onto an image surface includes six mirrors that include a first convex mirror, a second mirror, a third mirror, a fourth mirror, a fifth mirror, and a sixth mirror in order of reflections of light, wherein the light incident upon the third mirror from the second mirror intersects with the light incident upon the fifth mirror from the fourth mirror.

12 Claims, 9 Drawing Sheets

CATOPTRIC PROJECTION OPTICAL SYSTEM AND EXPOSURE APPARATUS HAVING THE SAME

This application claims a benefit of priority based on Japanese Patent Applications Nos. 2003-044887, 2003-044888 and 2003-044889 each filed on Feb. 21, 2003, each of which is hereby incorporated by reference herein in its entirety as if fully set forth herein.

BACKGROUND OF THE INVENTION

The present invention relates generally to an exposure apparatus, and more particularly to a reflection type or catoptric projection optical system, and an exposure apparatus using the same which use ultraviolet ("UV") and extreme ultraviolet ("EUV") light to expose objects, such as single crystal substrates for semiconductor wafers, and glass plates for liquid crystal displays ("LCDs").

Recent demands for smaller and lower profile electronic devices have increasingly demanded finer semiconductor devices to be mounted onto these electronic devices. For example, the design rule for mask patterns has required that an image with a size of a line and space ("L & S") of less than 0.1 μm be extensively formed. It is expected to require circuit patterns of less than 80 nm in the near future. L & S denotes an image projected onto a wafer in exposure with equal line and space widths, and serves as an index of exposure resolution.

A projection exposure apparatus as a typical exposure apparatus for fabricating semiconductor devices includes a projection optical system for exposing a pattern on a mask or a reticle, onto a wafer. The following equation defines the resolution R of the projection exposure apparatus (i.e., a minimum size for a precise image transfer) where λ is a light-source wavelength and NA is a numerical aperture of the projection optical system:

$$R = k_1 \times \frac{\lambda}{NA} \quad (1)$$

As the shorter the wavelength becomes and the higher the NA increases, the higher or finer the resolution becomes. The recent trend has required that the resolution be a smaller value; however it is difficult to meet this requirement using only the increased NA, and the improved resolution expects use of a shortened wavelength. Exposure light sources have currently been in transition from KrF excimer laser (with a wavelength of approximately 248 nm) and ArF excimer laser (with a wavelength of approximately 193 nm) to $F_2$ excimer laser (with a wavelength of approximately 157 nm). Practical use of the EUV light is being promoted as a light source.

As a shorter wavelength of light narrows usable glass materials for transmitting the light, it is advantageous for the projection optical system to use reflective elements, i.e., mirrors instead of refractive elements, i.e., lenses. No applicable glass materials have been proposed for the EUV light as exposure light, and a projection optical system cannot include any lenses. It has thus been proposed to form a catoptric projection optical system only with mirrors (e.g., multilayer mirrors).

A mirror in a catoptric reduction projection optical system forms a multilayer coating to enhance reflected light and increase reflectance, but the smaller number of mirrors is desirable to increase reflectance for the entire optical system.

As the EUV exposure apparatus has requires a smaller critical dimension or resolution than a conventional one, higher NA is necessary (e.g., up to 0.2 for a wavelength of 13.4 nm). Nevertheless, conventional three or four mirrors have a difficulty in reducing wave front aberration. Accordingly, the increased number of mirrors, such as six, as well as use of an aspheric mirror, is needed so as to increase the degree of freedom in correcting the wave front aberration. Hereinafter, such an optical system is referred to as a six-mirror system in the instant application. The six-mirror system has been disclosed, for example, in Japanese Patent Applications Publication Nos. 2000-100694 and 2000-235144, U.S. Pat. No. 6,033,079.

Another six-mirror system has been proposed, for example, which intersects light for high NA and possibly reduced mirror's effective diameters (see, for example, Japanese Patent Application Publication No. 2002-006221, and International Publication WO 02/056114A2, and U.S. Pat. No. 5,815,310).

The six-mirror catoptric projection optical system proposed in Japanese Patent Application Publication No. 2002-006221 intersects light from a second mirror M2 to a third mirror with light from a fourth mirror to a fifth mirror so as to reduce mirror's effective diameter, but it has a long span. A small mirror's effective diameter is advantageous to processing and measurements, but a long span and a large volume make it difficult to draw a vacuum in an optical path and to prevent the EUV light from being absorbed in the air.

In addition, an interval between an object surface and a second mirror M2 arranged close to the object surface is very small, such as 50 mm in the first embodiment and 70 mm in the second embodiment. Usually, a reticle is located as an original form of a pattern at an object surface. As this reticle should be exchanged and scanned in exposing a pattern, a stage mechanism should be located near the reticle at sufficiently wide space when the reticle is to be applied to an actual exposure apparatus.

An intermediate image located close to the third mirror M3 causes the energy to concentrate on the third mirror M3, thermally induces aberration, and deteriorates images due to contaminations. Moreover, an arrangement of surface shapes from an object side to an image side, such as concave, concave, concave, concave, convex and concave, has a difficulty in reducing a Petzval sum, and uses only a narrow slit width, such as 0.8 mm.

While a six-mirror catoptric projection optical system proposed in International Publication No. WO 02/056114A2 intersects light from a second minor M2 to a third mirror with light from a fourth mirror to a fifth mirror, a first mirror Ml has such a concave surface that light incident upon the second mirror M2 from the first minor M1 remarkably inclines relative to the optical axis. As a result, a subsequent mirror disadvantageously has a large effective diameter, for example, the fourth minor has a large effective diameter, such as 670 mm. In addition, a long span of 1500 mm has a difficulty in realization in view of processing, measurements, vacuum stability, etc. A large angle between exit light from the first reflective surface and an optical axis also causes the fifth and sixth reflective surfaces to have very large effective diameters. In particular, the effective diameter of the fifth reflective surface is considered to be about 650 mm for NA of 0.25, and a realization becomes difficult in view of a large apparatus and difficult processing and measurements.

While a six-mirror catoptric projection optical system proposed in U.S. Pat. No. 5,815,310 intersects light from a second mirror M2 to a third mirror with light from a fourth mirror to a fifth mirror, a first mirror M1 has such a convex surface that light incident upon the second mirror M2 from the first mirror M1 remarkably inclines relative to the optical axis. As a result, a subsequent mirror disadvantageously has a large effective diameter, such as 500 mm. In addition, an intermediate image located close to the fourth mirror M4 causes the energy to concentrate on the fourth mirror M4, thermally induces aberration, and degrades images due to contaminations.

As the exposure apparatus is usually accommodated in a clean room, and its entire size is limited due to facility restrictions and thus the span of the optical system is limited. In exposure using the EUV light, it is absorbed in the air and the optical path should be made vacuum. Therefore, the size of the optical system is limited from vacuum drawing efficiency. Thus, there should be a sufficient interval between the object surface and (a reflective surface of) a mirror closest to the object surface without increasing the span of the optical system (a distance from the object surface to the image surface) and the effective diameter.

While the catoptric projection optical system in Japanese Patent Publication No. 2000-100694 discloses two embodiments using six-mirror systems with NA of 0.14 and NA of 0.16, the first embodiment with NA of 0.14 is substantially a five-mirror system because the fourth mirror M4 is a plane mirror, which has a difficulty in increasing NA. In addition, the second embodiment with NA of 0.16 uses a spherical mirror for the fourth mirror M4, increasing the degree of design freedom, but requires a distance from the object surface to the image surface is 2 m or greater and has a difficulty in realization.

Either embodiment forms an intermediate image between the second and third mirrors M2 and M3, and arranges four mirrors from the intermediate image to the image surface. Therefore, as a beam width becomes larger with higher NA, a beam enlarges particularly from the intermediate image to the image surface, and has a difficulty in separating mirrors from a beam other than a desired beam and arranging them. Therefore, neither the first embodiment nor the second embodiment can achieve high NA of 0.16 or greater. A compulsory attempt to arrange mirrors would cause another problem to make the maximum effective diameter larger.

Moreover, a distance between the object surface and the mirror M2 closest to the object surface is small, e.g., 20 mm to 30 mm. For example, as shown in FIG. 2, a distance between the second mirror M2 and the mask R is very long. Understandably, it is difficult to apply two optical systems disclosed in Japanese Patent Publication No. 2000-100694 to an actual exposure apparatus.

While an effective diameter of a sixth mirror M6 as a final reflective surface and an optical effective surface enlarge as NA becomes higher, these mirrors should be held with precision. However, the first embodiment extremely narrows an interval between the final reflective surface and a reflective surface closest to a rear surface of the final reflective surface (or an interval between a first mirror M1 and a rear surface of the sixth mirror M6), making holding difficult. Holding becomes more difficult as NA becomes higher. The second embodiment arranges a stop near the first mirror M1, disadvantageously increasing the number of members relating to the stop for adjusting the NA using the variable stop, in addition to hard holding of the final reflective surface. While the second embodiment attempts to expand an interval between a final reflective surface and a reflective surface closest to a rear surface of the final reflective surface (or an interval between a first mirror M1 and a rear surface of the sixth mirror M6), a long distance between the object surface and the image surface, such as 2 m or longer, has a difficulty in realization.

Japanese Patent Publication No. 2000-235144 also discloses catoptric projection optical systems as six-mirror embodiments with high NAs of 0.2, 0.28 and 0.30. Similarly, however, as a distance between the object surface and the mirror M2 closest to the object surface is small, e.g., 80 mm to 85 mm, it is difficult to arrange a stage mechanism for scanning a mask located on the object surface. In addition, it is the fourth mirror M4 that has the maximum effective diameter in either embodiment, and the diameter is large, e.g., 540 mm or greater for NA of 0.2. The largest effective diameter is a diameter larger than 650 mm for NA of 0.28, and the mirror's maximum effective diameter increases simultaneous with high NA. In addition, a distance between a final reflective surface and a reflective surface closest to a rear surface of the final reflective surface (or an interval between a third mirror S3 and a rear surface of a sixth mirror S6) is narrow.

U.S. Pat. No. 6,033,079 discloses two typical six-mirror catoptric projection optical systems, which receive light from the object surface, form an intermediate image via first to fourth reflective surfaces, and re-form the intermediate image on an image surface via a convex fifth reflective surface and a concave sixth reflective surface. Such a structure contributes to high NA by enlarging and introducing light to sixth reflective surface and condensing the entire light on the image surface. Thus, the sixth reflective surface has a large effective diameter. The intermediate-image should be formed after the fourth reflective surface to introduce the light into the fifth reflective surface while preventing the sixth reflective surface from shielding the light.

However, an optical system disclosed in U.S. Pat. No. 6,033,079 has a first convex reflective surface that makes relatively large an angle between exit light from a first reflective surface and an optical axis, and thus a reflective surface at a subsequent stage has a large effective diameter. In this optical system, it is a fourth reflective surface that defines a maximum effective diameter. Since an intermediate image is formed at a position apart from the fourth reflective surface, the fourth reflective surface widely extends and its effective diameter becomes large. As a result, an effective diameter becomes very large, such as 700 mm for NA of 0.25, and a realization becomes difficult in view of a large apparatus and hard processing and measurements. In addition, since the intermediate image is formed apart from the fourth reflective surface and close to a fifth reflective surface, a third reflective surface extends relatively widely. It is more difficult to arrange the third reflective surface, which tends to be located at a position congested with light.

International Publication No. WO 02/056114A2 also discloses a six-mirror catoptric projection optical system. Different from ones disclosed in U.S. Pat. No. 6,033,079, this catoptric projection optical system forms an intermediate image after the second reflective surface and introduces roughly collimated light into the fifth reflective surface.

BRIEF SUMMARY OF THE INVENTION

Accordingly, it is an exemplified object of the present invention to provide a six-mirror catoptric projection optical system with a high NA and excellent imaging performance, and an exposure apparatus using the same, which are applicable to the EUV lithography, and reduce a maximum effective diameter and a span of the optical system and/or maintain spaces for a stage mechanism, a mirror holder, etc. as well as preventing light-shielding on the final reflective surface.

A catoptric projection optical system of one aspect according to the present invention for projecting a reduced size of a pattern on an object surface onto an image surface includes six mirrors that include a first convex mirror, a second mirror, a third mirror, a fourth mirror, a fifth mirror, and a sixth mirror in order of reflections of light, wherein the light incident upon the third mirror from the second mirror intersects with the light incident upon the fifth mirror from the fourth mirror.

The catoptric projection system may form an intermediate image between the second mirror and the third mirror on an optical path. The second mirror may be located at a position of an aperture stop. The numerical aperture may be greater than 0.2. A displacement direction of a principal ray viewed from an optical axis from the first mirror to the second mirror may be reverse to that from the third mirror to the sixth mirror. The catoptric projection optical system is non-telecentric at a side of object surface.

The six mirrors may form a coaxial system. At least one of the six mirrors may be aspheric mirrors including a multilayer coating that reflect light having a wavelength of 20 nm or smaller. All of the six mirrors may be aspheric mirrors including a multilayer coating that reflect light having a wavelength of 20 nm or smaller. The light may have a wavelength of 20 nm or smaller. The catoptric projection optical system may be telecentric at a side of the image surface. A reflection mask may be arranged on the object surface. The catoptric projection optical system may include six mirrors that include a first convex mirror, a second mirror, a third mirror, a fourth mirror, a fifth mirror, and a sixth mirror in order of reflections of light from the object surface to the image surface.

A catoptric projection optical system of another aspect according to the present invention includes plural reflective surfaces and projects a reduced size of a pattern on an object surface onto an image surface by reflecting light from the pattern on the plural reflective surfaces, wherein the catoptric projection optical system has a numerical aperture of 0.2 or greater, and forms an intermediate image between the object surface and the image surface on an optical path, wherein LMS/L$12$>1 and LW/L$12$>1 are met, where L$12$ is an interval between a first reflective surface, upon which the light from the pattern first is incident, and a second reflective surface as a surface, upon which the light from the pattern is incident subsequent to the first reflective surface, LMS is an interval between the object surface and a reflective surface closest to the object surface, and LW is an interval between a rear surface of a final reflective surface in the catoptric projection optical system and a reflective surface closest to the rear surface of the final reflective surface. LSM/L$12$<3 and LW/L$12$<2 may be met. 1.3<LSM/L$12$<3 and 1.3<LW/L$12$<2 may be met. The catoptric projection optical system may include a first convex mirror, a second mirror, a third mirror, a fourth mirror, a fifth mirror, and a sixth mirror in order of reflections of the light from the object surface to the image surface. A reflective surface closest to the object surface may be the second reflective surface, and a reflective surface closest to and at the side of a rear surface of the final reflective surface is the first light.

A catoptric projection optical system of another aspect according to the present invention for projecting a reduced size of a pattern on an object surface onto an image surface includes six mirrors that include, from the object surface to the image surface, a first mirror, a second mirror, a third mirror, a fourth mirror, a fifth mirror, and a sixth mirror in order of reflections of light., wherein the first mirror has a convex or plane shape, and wherein an intermediate image is formed from the second mirror to the fourth mirror on an optical path.

An intermediate image may be formed from the third mirror to the fourth mirror on an optical path. The catoptric projection optical system may include, in order from the object surface to the image surface, a second mirror, a first mirror, a fourth mirror, a sixth mirror, a third mirror, and a fifth mirror, wherein the intermediate image is formed between the fourth mirror and the third mirror. An intermediate image may be formed from the sixth mirror to the third mirror on an optical path.

The catoptric projection optical system may include, in order from the object surface to the image surface, a second mirror, a first mirror, a sixth mirror, a fourth mirror, a third mirror, and a fifth mirror, wherein the intermediate image is formed between the sixth mirror and the third mirror. An intermediate image may be formed from the sixth mirror to the fourth mirror on an optical path. The catoptric projection optical system may include, in order from the object surface to the image surface, a second mirror, a first mirror, a fourth mirror, a third mirror, a sixth mirror, and a fifth mirror, wherein the intermediate image is formed between the fourth mirror and the third mirror.

A catoptric projection optical system of another aspect according to the present invention for projecting a reduced size of a pattern on an object surface onto an image surface includes six mirrors that include, from the object surface to the image surface, a first convex or plane mirror, a second mirror, a third convex or plane mirror, a fourth mirror, a fifth mirror, and a sixth mirror in order of reflections of light, wherein an intermediate image is formed from the second mirror to the third mirror on an optical path.

An exposure apparatus of another aspect according to the present invention includes the above catoptric projection optical system, and a mask stage that supports a mask having the pattern, and positions the pattern on the mask onto the object surface, a wafer stage that supports an object having a photosensitive layer, and positions the photosensitive layer on the image surface, and a mechanism for synchronously scanning the mask stage and the wafer stage while the mask is illuminated by light having a wavelength of 20 nm or smaller.

An exposure apparatus of another aspect according to the present invention includes an illumination optical system for illuminating a pattern with light from a light source, and the above catoptric projection optical system. The projection optical system may project light reflected on the pattern, onto the image surface.

A device fabricating method includes the steps of exposing an object using the above exposure apparatus, and developing the exposed object. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
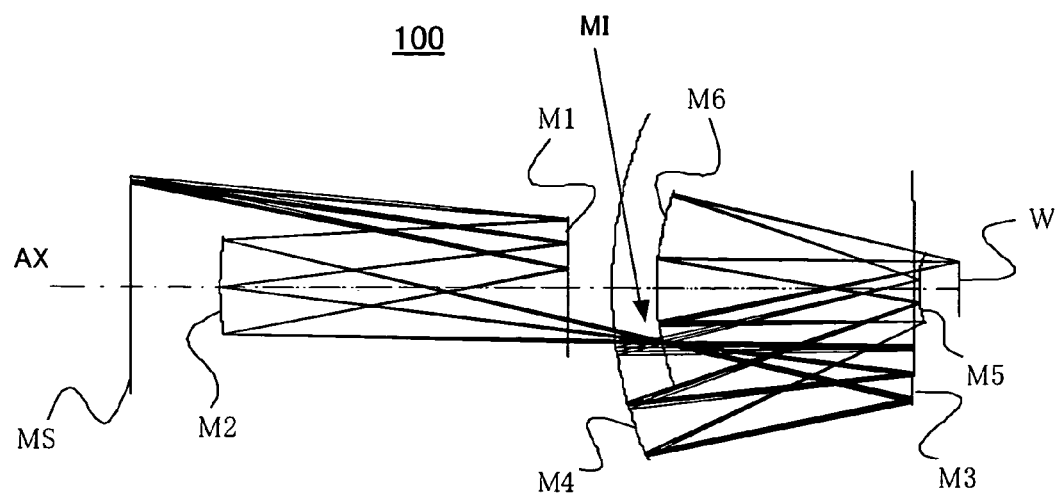
FIG. 1 is a schematic structure of a catoptric projection optical system of a first embodiment according to the present invention.

A description will now be given of catoptric projection optical system 100 of a first embodiment according to the present invention, with reference to the accompanying drawings. The same reference numeral in each figure denotes the same element, and a description thereof will be omitted. Here, FIG. 1 is a schematic structure of the catoptric projection optical system 100. Unless otherwise specified, the catoptric projection optical system 100 generalizes a catoptric reduction projection optical system 100A.

Referring to FIG. 1, the inventive catoptric projection optical system 100 is an optical system that projects a reduced size of a pattern on an object plane MS (for example, on a mask surface) onto an image plane W (for example, on a plane of an object to be exposed such as a plate), and particularly an optical system suitable for EUV light (with a wavelength, for example, of 13.4 nm to 13.5 nm).

The catoptric projection optical system 100 basically has six mirrors including, in order of sequential reflections of light from an object surface MS, a first (convex) mirror M1, a second (concave) mirror M2, a third (plane) mirror M3, a fourth (concave) mirror M4, a fifth (convex) mirror M5, and a sixth (concave) mirror M6. The first and second mirrors M1 and M2 form an intermediate image MI, which is in turn re-imaged on an image surface M by the third to six mirrors M3 to M6.

Characteristically, the catoptric projection optical system 100 reduces a maximum effective diameter of the fourth mirror M4 that has the largest effective diameter, an incident angle upon the fifth mirror M5 that has the largest incident angle, and a span from the object surface MS to the image surface W. Concrete values will be discussed later.

The catoptric projection optical system 100 is so non-telecentric that light incident upon the first mirror M1 from the object surface MS has an incident angle of 5° or greater. In addition, the catoptric projection optical system 100 is telecentric with respect to the exit light at the image surface W side. For example, the object surface MS side needs a certain incident angle, in order to illuminate a mask arranged on the object surface MS through an illumination optical system, and to form an image on a wafer located at the image surface W. On the other hand, the image surface W side is preferably telecentric to reduce a change of magnification, for example, when the wafer located at the object surface MS moves in the optical axis direction.

The inventive projection optical system 100 is arranged substantially as a coaxial optical system that is axially symmetrical around one optical axis, has an advantage in that a ring-shape image surface around the optical axis can preferably correct aberration. However, the six mirrors in the catoptric projection optical system 100 do not have to be arranged perfectly coaxial for aberrational corrections or adjustments. For example, they may slightly decenter for aberrational improvements or improve the degree of freedom in arrangement.

The catoptric projection optical system is indispensable to the EUV optical system, and required to reduce light shielding at the image surface W side as higher NA is demanded. The instant embodiment forms the intermediate image MI between the second and third mirrors M2 and M3, and arranges it near the sixth mirror M6 that requires a large effective diameter for high NA. Thus, the instant-embodiment maintains an effective diameter of each mirror small, and prevents light-shielding. In addition, the instant embodiment enhances powers of the fifth and sixth mirrors M5 and M6. Preferably, the fifth and sixth mirrors M5 and M6 are convex and concave mirrors, respectively, for imaging with high NA and maintained back focus. Here, the "back focus" means an interval between the last mirror surface and the image surface (W).

A description will be given of functions of the first to sixth mirrors M1 to M6 in the catoptric projection optical system 100, and advantages of an intersection of light. A multilayer coating for reflecting the EUV light is applied onto a surface of each of the first to sixth mirrors M1 to M6, and serves to enhance the light. A multilayer coating that can reflect the EUV light having a wavelength of 20 nm or smaller can include, for example, a Mo/Si multilayer coating including alternately laminated molybdenum (Mo) and silicon (Si) layers or a Mo/Be multilayer coating including alternately laminating molybdenum. (Mo) and beryllium (Be) layers. An optimal material is selected according to wavelengths to be used. Of course, the present invention does not limit the multilayer coating to the above materials, and may use any multilayer coating that has an operation or effect similar to that of the above. Moreover, an excessively large incident angle would deteriorate reflective performance of a multilayer coating, and thus an incident angle upon every mirror (i.e., the first mirror M1 to the sixth mirror M6). The catoptric projection optical system 100 reduces an effective diameter of a mirror, a span of the optical system (or a volume), and an incident angle upon each mirror.

For example, a catoptric optical system proposed in Japanese Patent Application Publication No. 2000-100694, which does not intersect light in an optical system, restricts an incident angle upon a mirror and reduces an incident angle upon the fifth mirror so that the sixth mirror does not shield the light. In addition, the fourth mirror is located near the object surface to reduce an incident angle upon the third mirror, and this arrangement makes large the effective diameter of the fourth mirror, such as 540 mm or greater relative to NA=0.2. Among the embodiments, the largest maximum effective diameter exceeds 650 mm relative to NA=0.28. The mirror's maximum effective diameter increases with NA.

The catoptric optical system 100 shifts the third and fourth mirrors M3 and M4 towards the image surface W, in comparison with a catoptric projection optical system proposed in Japanese Patent Application Publication No. 2000-100694 in order to prevent the fourth mirror M4 from having a large effective diameter. In this case, an intermediate image is formed between the second and third mirrors M2 and M3. The light is allowed to pass near the sixth mirror M6 at the optical path side of the fourth mirror M4. The fourth mirror M4 intersects the light after the light is reflected on the third mirror M3, with the light exit from the second mirror M2, and allows the light to return to the optical axis side. Thereby, the light is prevented from being shielded even when the third and fourth mirrors M3 and M4 have reduced effective diameters.

The first mirror M1 is a convex mirror to reduce an angle between exit light from the second mirror M2 and the optical axis. The first mirror M1 reflects a principal ray exit from the object surface, and brings the light close to the optical axis. A concave mirror has a more angle relative to the optical axis than the convex mirror, possibly causing a subsequent mirror to have a large effective diameter. Therefore, the convex mirror is preferable. As discussed, such an arrangement that intersects light and properly determines an intermediate image forming position that thins light would reduce a mirror's effective diameter and an incident angle upon a mirror, and lessen a volume of an optical system through a shaped optical path.

Preferably, the second mirror M2 in the catoptric projection optical system 100 forms an intermediate image near the sixth mirror M6, and is such a concave mirror to separate the light from mirrors without shielding of the light. The third mirror M3 is preferably a plane or concave mirror to bring the light close to the optical axis after the light is reflected by the mirror M2 towards a direction apart from the optical axis. Use of a convex mirror for the third mirror M3 would enlarge an effective diameter of the fourth mirror. The fourth mirror M4 is preferably a concave mirror since it is necessary to return the light to the optical axis direction, and the above effects-can be obtained in this case by intersecting the light with the light incident upon the third mirror M3 from the second mirror M2.

Although the catoptric projection optical system 100 includes six mirrors, it needs at least one or more aspheric mirrors. A shape of the aspheric surface is defined as Equation 2 as an equation of a generic aspheric surface. However, as a mirror having an aspheric surface advantageously facilitates a correction of aberration, the aspheric surface is preferably applied to many possible (desirably, sixth) mirrors:

$$Z = \frac{ch^2}{1+\sqrt{1-(1+k)c^2h^2}} + Ah^4 + Bh^6 + \\ Ch^8 + Dh^{10} + Eh^{12} + Fh^{14} + Gh^{16} + Hh^{18} + Jh^{20} + \ldots \quad (2)$$

where "Z" is a coordinate in an optical-axis direction, "c" is a curvature (i.e., a reciprocal number of the radius r of curvature), "h" is a height from the optical axis, "k" is a conic constant, "A" to "J" are aspheric coefficients of $4^{th}$ order, $6^{th}$ order, $8^{th}$ order, $10^{th}$ order, $12^{th}$ order, $14^{th}$ order, $16^{th}$ order, $18^{th}$ order, $20^{th}$ order, respectively.

The catoptric projection optical system 100 arranges an aperture stop on the second mirror M2, but may arrange the aperture stop between the first and second mirrors M1 and M2. The aperture stop arranged on the second mirror M2 facilitates a reduction of the light shielding, and can use a circular aperture stop. The aperture stop may have a variable or fixed diameter. When the variable diameter is used, a variation of the aperture stop's diameter would advantageously change NA of the optical system and provide a deep depth of focus, thereby stabilizing images.

Figure 2:
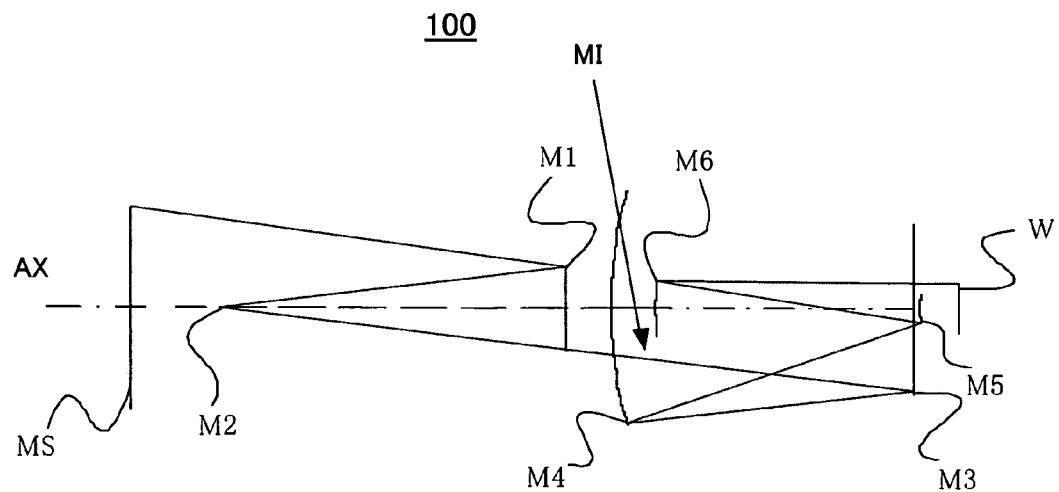
FIG. 2 is a schematic sectional view for explaining an intersection of light in the catoptric projection optical system shown in FIG. 1.

Referring now to FIGS. 1 and 2, a description will now be given of illumination experiment results using the catoptric projection optical system 100. FIG. 2 is a schematic sectional view for explaining an intersection of light in the catoptric projection optical system shown in FIG. 1. In FIGS. 1 and 2, MS is a reflection mask located at the object surface, and W is a wafer located at the image surface.

The catoptric projection optical system 100 illuminates the mask MS using an illumination system (not shown) for emitting the EUV light with a wavelength of about 13.4 nm, and reflects the reflected EUV light from the mask MS via the first (convex) mirror M1, the second mirror M2, the third mirror M3, the fourth mirror M4, the fifth mirror M5, and the sixth mirror in this order. Then, a reduced image of the mask pattern is formed on the wafer W located at the image surface. The catoptric projection optical system 100 forms, as shown in FIG. 2, intersects light incident upon the third mirror M3 from the second mirror M2 with light incident upon the fifth mirror M5 from the fourth mirror M4 at a position CR.

The catoptric projection optical system 100 has a numerical aperture at the image side NA=0.24, a reduction=1/4, an object point of 128 to 136 mm, and an arc-shaped image field with a width of 8 mm. Table 1 indicates the numerical values (such as radius of curvature, surface intervals, and coefficients of aspheric surfaces) of the catoptric projection optical system 100.

TABLE 1

| MIRROR NUMBERS | RADII OF CURVATURE (mm) | SURFACE INTERVALS (mm) |
|---|---|---|
| MS(MASK) | ∞ | 491.891361 |
| M1 | 3842.26663 | −391.891361 |
| M2 | 632.52970 | 782.331412 |
| M3 | ∞ | −340.568055 |
| M4 | 587.99023 | 347.083318 |

TABLE 1-continued

| | | | | |
|---|---|---|---|---|
| M5 | | 179.04357 | | −296.955313 |
| M6 | | 384.58260 | | 340.955313 |
| W(WAFRR) | | ∞ | | |

| ASPHERIC COEFFICIENTS | K | A | B | C | D |
|---|---|---|---|---|---|
| M1 | −267.466169 | −0.780044E−08 | 0.413260E−12 | 0.821038E−16 | −0.200255E−19 |
| M2 | −2.628436 | 0.171127E−08 | −0.104963E−13 | 0.216368E−18 | −0.70567E−21 |
| M3 | 0.000000 | −0.181104E−08 | 0.354552E−13 | −0.656727E−18 | 0.252501E−22 |
| M4 | −0.501490 | 0.499639E−10 | 0.551481E−15 | 0.621448E−19 | −0.685647E−24 |
| M5 | 0.652186 | 0.128818E−07 | −0.122531E−11 | 0.127459E−15 | 0.157924E−18 |
| M6 | 0.042239 | 0.631614E−10 | 0.118303E−14 | 0.263860E−19 | −0.553148E−23 |

| | E | F | G | H | J |
|---|---|---|---|---|---|
| M1 | 0.340696E−23 | −0.340597E27 | 0.205891E−31 | −0.753544E−36 | 0.120592E−40 |
| M2 | 0.459327E−24 | −0.140249E−27 | 0.168151E−31 | 0.621929E−36 | −0.219060E−39 |
| M3 | −0.293865E−27 | −0.106101E−30 | 0.825731E−35 | −0.238636E−39 | 0.244235E−44 |
| M4 | −0.548455E−29 | 0.497703E−33 | −0.655280E−38 | 0.216986E−43 | 0.141825E−49 |
| M5 | −0.265980E−21 | 0.188753E−24 | −0.715690E−28 | 0.130902E−31 | −0.753336E−36 |
| M6 | 0.953036E−27 | −0.841706E−31 | 0.383038E−35 | −0.725584E−40 | 0.870100E−46 |

Aberration that does not include manufacture errors and is a maximum value at several object points in the catoptric projection optical system 100 is wave front aberration of 0.055 λrms, and static distortion of 2 nmPV. A minimum distance between the object surface MS and a reflective surface (or a distance between the object surface MS and the second mirror M2) is 100 mm, enough to avoid interference among a stage mechanism on the object surface MS and an illumination system.

The optical system has a very small span, such as 932.8 mm, from the object surface MS to the image surface W, and can reduce its volume in addition to the small maximum effective diameter, advantageous to drawing a vacuum. The fourth mirror M4 has a small maximum effective diameter of 427.4 mm. The fifth mirror M5 has the largest incident angle of 18.15°. The excessively large incident angle causes the reflective performance of the multilayer coating to deteriorate, and it is important to maintain an incident angle upon each mirror as small as possible. Apparently, the value in the instant embodiment is sufficiently small.

An inclination of a principal ray from the object surface MS to the first mirror M1 is 9.0138°, enough to enable the illumination optical system to illuminate the reticle MS placed on the object surface to form an image on the wafer W on the image surface.

Thus, the catoptric projection optical system 100 maintains high NA, such as 0.2 or greater (preferably 0.25 or greater) for a wavelength of the EUV light, and reduces the mirror's maximum effective diameter and incident angle as well as its span. In addition, the catoptric projection optical system 100 sufficiently maintains a minimum distance between the object surface MS and the mirror, and prevents interference between a stage mechanism on the object surface MS and the illumination optical system. Moreover, the catoptric projection optical system 100 maintains the side of the object surface MS non-telecentric, and illuminates the reticle placed on the object surface MS to form an image on the image surface W, providing excellent imaging performance.

Figure 3:
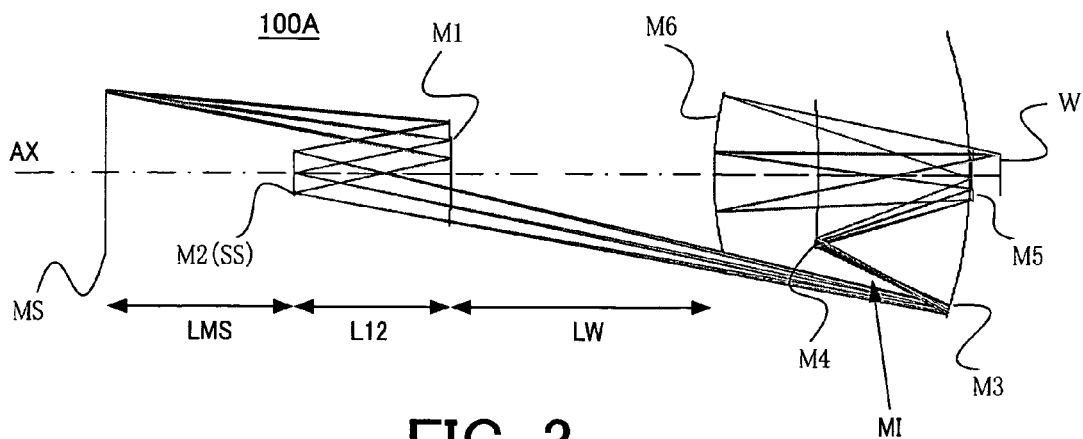
FIG. 3 is a schematic structure of a catoptric projection optical system of a second embodiment according to the present invention.
Figure 4:
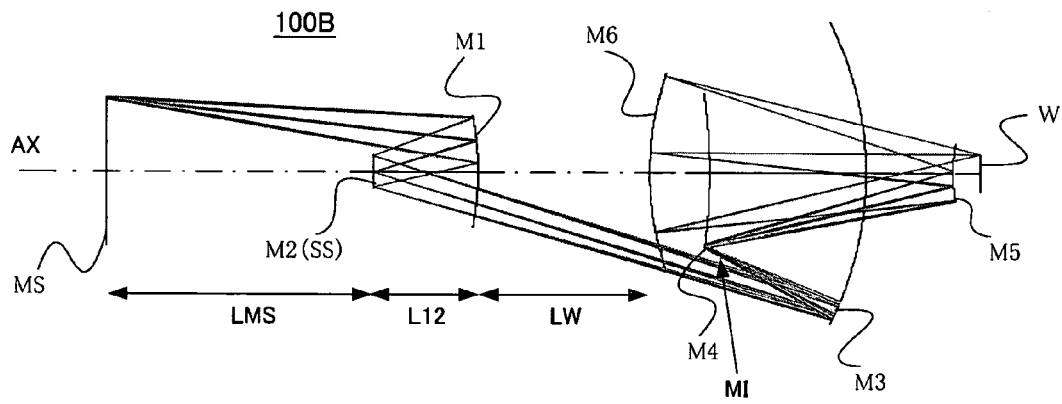
FIG. 4 is a schematic structure of a catoptric projection optical system of a third embodiment according to the present invention.
Figure 5:
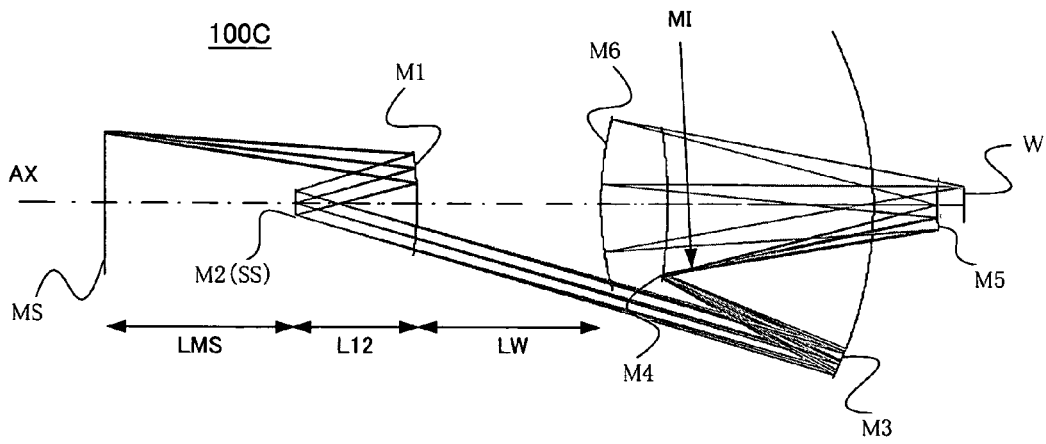
FIG. 5 is a schematic structure of a catoptric projection optical system of a fourth embodiment according to the present invention.

Referring now to FIGS. 3 to 5, a description will now be given of catoptric projection optical systems 100A to 100C of second to fourth embodiments according to the present invention. Here, FIGS. 3 to 5 are schematic structures of the catoptric projection optical systems 100A to 100C.

Referring to FIG. 3, the inventive catoptric projection optical system 100A is an optical system that projects a reduced size of a pattern on an object plane MS (for example, on a mask surface) onto an image plane W (for example, on a-plane of an object to be exposed such as a plate), and particularly an optical system suitable for EUV light (with a wavelength, for example, of 13.4 nm to 13.5 nm).

The catoptric projection optical system 100A basically has six mirrors including, in order of sequential reflections of light from an object surface MS, a first (concave) mirror M1, a second (concave) mirror M2, a third (concave) mirror M3, a fourth (convex) mirror M4, a fifth (convex) mirror M5, and a sixth (concave) mirror M6. The three mirrors, i.e., the first to third mirrors M1 to M3 form an intermediate image MI, which is in turn re-imaged on an image surface M by the three mirrors, i.e., the fourth to sixth mirrors M4 to M6.

The catoptric projection optical system 100A is characterized in that an interval LMS between the object surface MS and a reflective surface (or the second mirror M2) closest to the object surface MS and an interval LW between a rear surface of a final reflective surface (or the sixth mirror M6 in this embodiment) and a reflective surface closest to the rear surface (or the first mirror M1) are longer than an interval L12 between the first mirror M1 and the second mirror M2. Concrete values will be described later.

The catoptric projection optical system 100A is so non-telecentric that light incident upon the first mirror M1 from the object surface MS has an incident angle of 5° or greater. In addition, the catoptric projection optical system 100A is telecentric with respect to the exit light at the image surface W side. For example, the object surface MS side needs a certain incident angle, in order to illuminate a mask arranged on the object surface MS through an illumination optical system, and to form an image on a wafer located at the image surface W. On the other hand, the image surface W side is preferably telecentric to reduce a change of magnification, for example, when the wafer located at the object surface MS moves in the optical axis direction.

The inventive projection optical system 100A is arranged substantially as a coaxial optical system that is axially symmetrical around one optical axis, has an advantage in that a ring-shape image surface around the optical axis can preferably, correct aberration. However, the six mirrors in the catoptric projection optical system 100A do not have to be arranged perfectly coaxial for aberrational corrections or adjustments. For example, they may slightly decenter for aberrational improvements or improve the degree of freedom in arrangement.

The catoptric projection optical system is indispensable to the EUV optical system, and required to reduce light shielding at the image surface W side as higher NA is demanded. The instant embodiment forms the intermediate image MI between the third and fourth mirrors M3 and M4. In addition, the first mirror M1 that reflects a principal ray emitted from the object surface MS towards the optical axis uses a concave mirror so as to maintain a more angle relative to the optical axis than the convex mirror. Thereby, the light is prevented from being shielded by the final reflective surface (or the sixth mirror M6) which tends to enlarge as NA becomes higher. Moreover, the instant embodiment enhances powers of the fifth and sixth mirrors M5 and M6. Preferably, the fifth and sixth mirrors M5 and M6 are convex and concave mirrors, respectively, for imaging with high NA and maintained back focus.

This embodiment illustratively indicates a representative example of surface shapes of six mirrors in the catoptric projection optical system 100A, and the present invention is not limited to this form. As described later, surface shapes of mirrors in the catoptric projection optical system 100A are replaceable between a convex and a concave. In addition, the instant embodiment does not limit a detailed position of an intermediate image MI between the object surface MS and the image surface W.

Although the catoptric projection optical system 100A includes six mirrors, as shown in FIG. 3, it needs at least one or more aspheric mirrors. A shape of the aspheric surface is defined as Equation 2 as an equation of a generic aspheric surface.

As shown in FIG. 3, the catoptric projection optical system 100A arranges an aperture stop SS on the second mirror M2, but may arrange the aperture stop SS between the first and second mirrors M1 and M2. The aperture stop SS arranged on the second mirror M2 facilitates a reduction of the light shielding; and can use a circular aperture stop. The aperture stop SS may have a variable or fixed diameter. When the variable diameter is used, a variation of the aperture stop's diameter would advantageously change NA of the optical system and provide a deep depth of focus, thereby stabilizing images.

A multilayer film coating for reflecting the EUV light is applied onto a surface of each of the first to sixth mirrors M1 to M6, and serves to enhance the light. A multilayer coating that can reflect the EUV light having a wavelength of 20 nm or smaller can include, for example, a Mo/Si multilayer coating including alternately laminated molybdenum (Mo) and silicon (Si) layers or a Mo/Be multilayer coating including alternately laminating molybdenum (Mo) and beryllium (Be) layers. An optimal material is selected according to wavelengths to be used. Of course, the present invention does not limit the multilayer coating to the above materials, and may use any multilayer coating that has an operation or effect similar to that of the above.

A description will now be given of illumination experiment results using the catoptric projection optical systems 100A to 100C. In FIGS. 3 to 5, MS is a reflection mask located at the object surface, and W is a wafer located at the image surface.

The catoptric projection optical systems 100A to 100C illuminate the mask MS using an illumination system (not shown) for emitting the EUV light with a wavelength of about 13.4 nm, and reflect the reflected EUV light from the mask MS via the first mirror M1, the second mirror M2, the third mirror M3, the fourth mirror M4, the fifth mirror M5, and the sixth mirror in this order. Then, a reduced image of the mask pattern is formed on the wafer W located at the image surface.

The catoptric projection optical system 100A has a numerical aperture at the image side NA=0.20, a reduction=1/4, an object point of 118 to 122 mm, and an arc-shaped image field with a width of 8 mm. Table 2 indicates the numerical values (such as radius of curvature, surface intervals, and coefficients of aspheric surfaces) of the catoptric projection optical system 100A.

TABLE 2

| MIRROR NUMBERS | RADII OF CURVATURE (mm) | SURFACE INTERVALS (mm) |
|---|---|---|
| MS(MASK) | ∞ | 537.841809 |
| M1 | −1465.54642 | −243.584206 |
| M2(STOP) | 1500.00000 | 1050.915200 |
| M3 | −602.18857 | −234.848620 |
| M4 | −1166.98836 | 237.403572 |
| M5 | 235.67738 | −401.363101 |
| M6 | 466.99168 | 445.363101 |
| W(WAFRR) | ∞ | |

| ASPHERIC COEFFICIENTS | K | A | B | C | D |
|---|---|---|---|---|---|
| M1 | −87.960315 | 0.15133E−08 | −0.348543E−12 | 0.342921E−16 | −0.199972E−20 |
| M2 | −0.114170 | 0.411163E−08 | 0.161416E−12 | 0.272128E−16 | −0.216871E−19 |
| M3 | −0.307135 | 0.409714E−09 | 0.798901E−15 | −0.264411E−19 | −0.834208E−24 |
| M4 | −0.705953 | 0.182346E−08 | 0.187885E−12 | 0.187469E−16 | −0.210147E−20 |
| M5 | 0.610295 | −0.644619E−08 | 0.149110E−10 | −0.318041E−14 | 0.207279E−18 |
| M6 | 0.003114 | 0.454350E−11 | −0.123324E−15 | 0.149354E−19 | −0.203236E−23 |

| | E | F | G |
|---|---|---|---|
| M1 | −0.364266E−25 | 0.144221E−28 | −0.666808E−33 |
| M2 | 0.119733E−22 | −0.189512E−26 | −0.211820E−30 |
| M3 | 0.226571E−29 | 0.358302E−33 | −0.317613E−38 |
| M4 | −0.671237E−25 | 0.129276E−28 | −0.367142E−33 |
| M5 | 0.648371E−21 | −0.346942E−24 | 0.594278E−28 |
| M6 | 0.137369E−27 | −0.476734E−32 | 0.657963E−37 |

Aberration that does not include manufacture errors and is a maximum value at several object points in the catoptric projection optical system 100A is wave front aberration of 0.071 λrms, and static distortion of 26 nmPV. A minimum shaped image field with a width of 8 mm. Table 3 indicates the numerical values (such as radius of curvature, surface intervals, and coefficients of aspheric surfaces) of the catoptric projection optical system 100B.

TABLE 3

| MIRROR NUMBERS | RADII OF CURVATURE (mm) | SURFACE INTERVALS (mm) |
|---|---|---|
| MS(MASK) | ∞ | 581.067433 |
| M1 | −532.759811 | −161.653593 |
| M2(STOP) | −861.117464 | 768.176722 |
| M3 | −591.481544 | −245.205666 |
| M4 | −927.464939 | 380.743764 |
| M5 | 309.874810 | −474.365304 |
| M6 | 550.77845 | 518.365304 |
| W(WAFRR) | ∞ | |

| ASPHERIC COEFFICIENTS | K | A | B | C | D |
|---|---|---|---|---|---|
| M1 | 5.019239 | 0.663760E−08 | −0.156445E−13 | 0.386207E−17 | −0.187843E−21 |
| M2 | −101.750488 | −0.607279E−08 | 0.244758E−11 | 0.556571E−16 | 0.411694E−20 |
| M3 | −0.467231 | −0.168937E−09 | 0.124438E−15 | −0.271843E−19 | 0.102024E−24 |
| M4 | −20.485840 | 0.75018E−09 | −0.291369E−13 | −0.682259E−18 | −0.518346E−22 |
| M5 | −1.742458 | 0.113717E−07 | 0.193024E−11 | −0.262926E−15 | 0.158672E−18 |
| M6 | 0.027117 | −0.187047E−11 | −0.631956E−17 | 0.588413E−21 | −0.590319E−25 |

| | E | F | G |
|---|---|---|---|
| M1 | 0.94888E−26 | −0.966476E−31 | −0.800305E−35 |
| M2 | 0.683807E−23 | −0.436330E−26 | 0.117221E−34 |
| M3 | 0.204602E−26 | 0.230061E−30 | −0.825630E−35 |
| M4 | 0.204602E−26 | 0.230061E−30 | −0.825630E−35 |
| M5 | −0.642246E−22 | 0.151281E−25 | −0.149457E−29 |
| M6 | 0.282238E−29 | −0.700304E−34 | 0.688577E−39 | distance LMS between the object surface MS and a reflective surface (or a distance between the object surface MS and the second mirror M2) is 294.3 mm, enough to avoid interference among a stage mechanism on the object surface MS and an illumination system.

The fourth mirror M4 has a small maximum effective diameter of 425.7 mm. The fourth mirror M4 has the largest incident angle of 24.54°. The excessively large incident angle causes the reflective performance of the multilayer coating to deteriorate, and it is important to maintain an incident angle upon each mirror as small as possible. Apparently, the value in the instant embodiment is sufficiently small.

An inclination of a principal ray from the object surface MS to the first mirror M1 is 7.9355°, enough to enable the illumination optical system to illuminate the reticle MS placed on the object surface to form an image on the wafer W on the image surface.

The interval LW between a rear surface of a final reflective surface (or the sixth mirror M6) and a reflective surface closest to the rear surface (or the first mirror M1) is 408.61 mm. The interval LMS between the object surface MS and a reflective surface (or the second mirror M2) closest to the object surface MS, and the interval L12 between the first mirror M1 and the second mirror M2 are given by the following Equations 3 and 4:

$$LMS/L12 = 1.208 \quad (3)$$

$$LW/L12 = 1.678 \quad (4)$$

The catoptric projection optical system 100B has a numerical aperture at the image side NA=0.26, a reduction=1/4, an object point of 122 to 126 mm, and an arc- Aberration that does not include manufacture errors and is a maximum value at several object points in the catoptric projection optical system 100B is wave front aberration of 0.039 λrms, and static distortion of 4.4 nmPV. A minimum distance LMS between the object surface MS and a reflective surface (or a distance between the object surface MS and the second mirror M2) is 419.4 mm, enough to avoid interference among a stage mechanism on the object surface MS and an illumination system.

The third mirror M3 has a small maximum effective diameter of 496.4 mm. The fourth mirror M4 has the largest incident angle of 25.13°. The excessively large incident angle causes the reflective performance of the multilayer coating to deteriorate, and it is important to maintain an incident angle upon each mirror as small as possible. Apparently, the value in the instant embodiment is sufficiently small.

An inclination of a principal ray from the object surface MS to the first mirror M1 is 7.1250°, enough to enable the illumination optical system to illuminate the reticle MS placed on the object surface to form an image on the wafer W on the image surface.

The interval LW between a rear surface of a final reflective surface (or the sixth mirror M6) and a reflective surface closest to the rear surface (or the first mirror M1) is 267.80 mm. The interval LMS between the object surface MS and a reflective surface (or the second mirror M2) closest to the object surface MS, and the interval L12 between the first mirror M1 and the second mirror M2 are given by the following Equations 5 and 6:

$$LMS/L12 = 2.594 \quad (5)$$

$$LW/L12 = 1.657 \quad (6)$$

The catoptric projection optical system 100C has a numerical aperture at the image side NA=0.20, a reduction=1/4, an object point of 188 to 122 mm, and an arc-shaped image field with a width of 4 mm. Table 4 indicates the numerical values (such as radius of curvature, surface intervals, and coefficients of aspheric surfaces) of the catoptric projection optical system 100C.

TABLE 4

| MIRROR NUMBERS | RADII OF CURVATURE (mm) | SURFACE INTERVALS (mm) |
|---|---|---|
| MS(MASK) | ∞ | 495.592792 |
| M1 | −658.184895 | −192.353168 |
| M2(STOP) | −1499.992309 | 915.104873 |
| M3 | −706.119589 | −327.220669 |
| M4 | −954.339746 | 427.094201 |
| M5 | 347.407160 | −532.572703 |
| M6 | 612.423567 | 576.677615 |
| W(WAFRR) | ∞ | |

| ASPHERIC COEFFICIENTS | K | A | B | C | D |
|---|---|---|---|---|---|
| M1 | −0.645779 | 0.290854E−09 | −0.213463E−13 | 0.496894E−18 | 0.884073E−22 |
| M2 | −288.633464 | 0.868185E−08 | 0.417686E−11 | −0.213859E−14 | 0.275424E−17 |
| M3 | −0.018150 | 0.835213E−11 | 0.118131E−15 | 0.518982E−21 | −0.849977E−26 |
| M4 | −1.931931 | 0.265225E−09 | 0.188053E−13 | 0.504350E−18 | −0.235345E−24 |
| M5 | 2.415356 | 0.752819E−08 | 0.815708E−12 | −0.134518E−15 | 0.162642E−19 |
| M6 | 0.008845 | 0.567295E−11 | 0.248722E−16 | −0.541763E−20 | 0.425700E−24 |

| | E | F | G |
|---|---|---|---|
| M1 | −0.916753E−26 | −0.221642E−30 | 0.358945E−34 |
| M2 | −0.186904E−23 | −0.104143E−11 | −0.121594E−29 |
| M3 | 0.231943E−33 | 0.381009E−36 | −0.110579E−41 |
| M4 | −0.969176E−27 | −0.853994E−31 | 0.386102E−35 |
| M5 | 0.496190E−22 | −0.289479E−25 | 0.527934E−29 |
| M6 | −0.184492E−28 | 0.392084E−33 | −0.316658E−38 |

Aberration that does not include manufacture errors and is a maximum value at several object points in the catoptric projection optical system 100C is wave front aberration of 0.026 λrms, and static distortion of 3.2 nmPV. A minimum distance LMS between the object surface MS and a reflective surface (or a distance between the object surface MS and the second mirror M2) is 303.2 mm, enough to avoid interference among a stage mechanism on the object surface MS and an illumination system.

The fourth mirror M4 has the largest incident angle of 23.3°. The excessively large incident angle causes the reflective performance of the multilayer coating to deteriorate, and it is important to maintain an incident angle upon each mirror as small as possible. Apparently, the value in the instant embodiment i's sufficiently small.

An inclination of a principal ray from the object surface MS to the first mirror M1 is 7.1021°, enough to enable the illumination optical system to illuminate the reticle MS placed on the object surface to form an image on the wafer W on the image surface.

The interval LW between a rear surface of a final reflective surface (or the sixth mirror M6) and a reflective surface closest to the rear surface (or the first mirror M1) is 289.95 mm. The interval LMS between the object surface MS and a reflective surface (or the second mirror M2) closest to the object surface MS, and the interval L12 between the first mirror M1 and the second mirror M2 are given by the following Equations 7 and 8:

$$LMS/L12=1.576 \quad (7)$$

$$LW/L12=1.507 \quad (8)$$

Thus, the catoptric projection optical systems 100A to 100C maintain high NA, such as 0.2 or greater (preferably 0.25 or greater) for a wavelength of the EUV light without increasing a span of the optical system, and maintain sufficient lengths for the interval LMS between the object surface MS and a reflective surface (or the second mirror M2) closest to the object surface MS, and the interval LW between a rear surface of a final reflective surface (or the sixth mirror M6) and a reflective surface closest to the rear surface (or the first mirror M1). Therefore, this optical system with a small volume prevents interference between a stage mechanism on the object surface MS and the illumination optical system, and arranges the final reflective surface (or the sixth mirror M6) without causing interference between the final reflective surface and a holder for another mirror holder even under high NA. Moreover, the catoptric projection optical system 100 maintains the side of the object surface MS non-telecentric, and illuminates the reticle placed on the object surface MS to form an image on the image surface W, providing excellent imaging performance.

Referring now to FIGS. 6 to 9, a description will now be given of catoptric projection optical systems 100D to 100G of second to fourth embodiments according to the present invention. Here, FIGS. 6 to 9 are schematic structures of the catoptric projection optical systems 100D to 100G.

Figure 6:
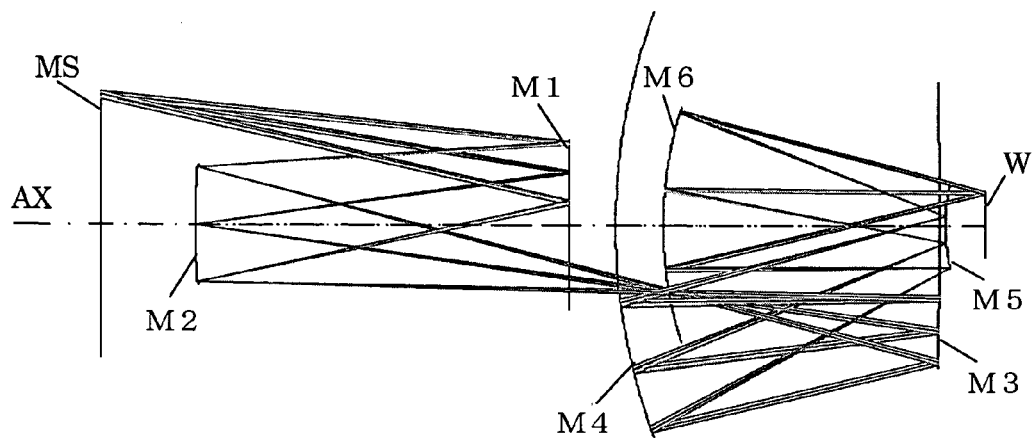
FIG. 6 is a schematic structure of a catoptric projection optical system of a fifth embodiment according to the present invention.
Figure 7:
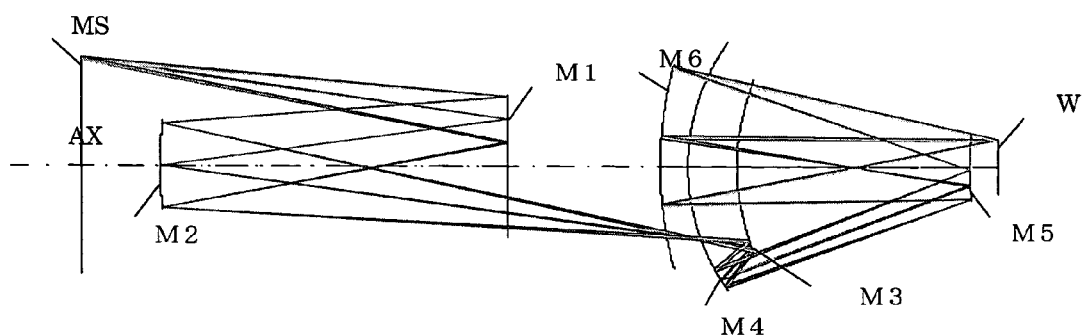
FIG. 7 is a schematic structure of a catoptric projection optical system of a sixth embodiment according to the present invention.
Figure 8:
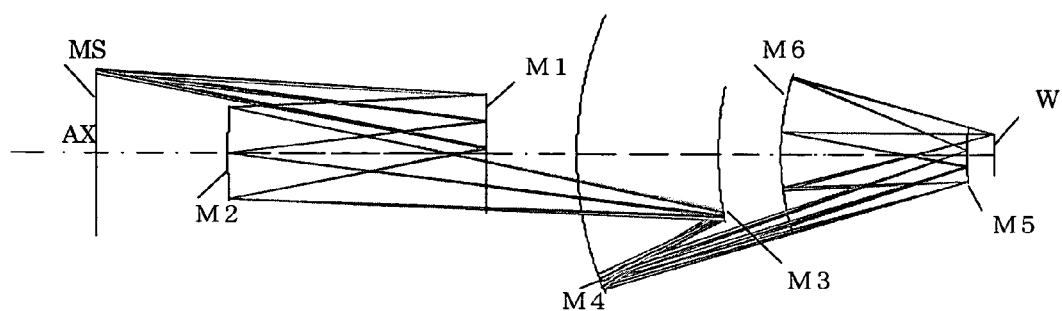
FIG. 8 is a schematic structure of a catoptric projection optical system of a seventh embodiment according to the present invention.
Figure 9:
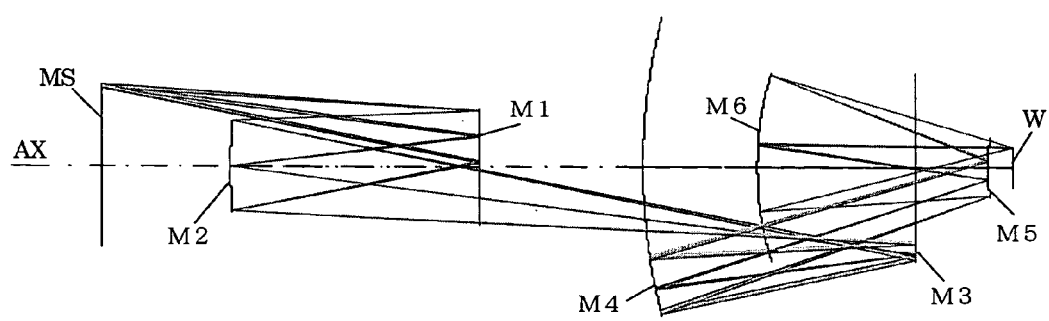
FIG. 9 is a schematic structure of a catoptric projection optical system of an eighth embodiment according to the present invention.

Referring to FIG. 6, the inventive catoptric projection optical system 100D is an optical system that projects a reduced size of a pattern on an object plane MS (for example, on a mask surface) onto an image plane W (for example, on a plane of an object to be exposed such as a plate), and particularly an optical system suitable for EUV light (with a wavelength, for example, of 13.4 nm to 13.5 nm).

The catoptric projection optical system 100D basically has six mirrors including, in order of sequential reflections of light from an object surface MS, a first (convex or plane) mirror M1, a second (concave) mirror M2, a third (convex or plane) mirror M3, a fourth (concave) mirror M4, a fifth (convex) mirror M5, and a sixth (concave) mirror M6. An intermediate image MI is formed between the second to fourth mirror M2 to M4 on an optical path, which is in turn re-imaged on an image surface M by the fifth and sixth mirrors M4 to M6.

Characteristically, the catoptric projection optical system 100D is non-telecentric with respect to light incident upon the first mirror M1 from the object surface MS, but is telecentric with respect to the exit light at the image surface W side. For example, the object surface MS side needs a certain incident angle, in order to illuminate a mask arranged on the object surface MS through an illumination optical system, and to form an image on a wafer located at the image surface W. On the other hand, the image surface W side is preferably telecentric to reduce a change of magnification, for example, when the wafer located at the object surface MS moves in the optical axis direction.

The inventive projection optical system 100D is arranged substantially as a coaxial optical system that is axially symmetrical around one optical axis, has an advantage in that a ring-shape image surface around the optical axis can preferably correct aberration. However, the six mirrors in the catoptric projection optical system 100D do not have to be arranged perfectly coaxial for aberrational corrections or adjustments. For example, they may slightly decenter for aberrational improvements or improve the degree of freedom in arrangement.

The catoptric projection optical system is indispensable to the EUV optical system, and required to reduce light shielding at the image surface W side as higher NA is demanded. The instant embodiment makes the first mirror M1 of a convex or plane mirror to reduce an angle between an optical axis and exit light from the first mirror M1 and lessen an effective diameter to reflect the light near the optical axis.

In addition, the catoptric projection optical system 100F forms an intermediate image IM near the third mirror M3, prevents light shielding on the sixth mirror M6 having a large effective diameter, and restrains the expansion of the fourth mirror M4 for a reduced maximum effective diameter. The catoptric projection optical system 100F restrains the expansion of the third mirror M3 that tends to be located near a position congested with light, and facilitates an arrangement of the third mirror M3.

The catoptric projection optical systems 100D to 100G form an intermediate image between the second mirror M2 and the third mirror M3, preventing light shielding on the sixth mirror M6 having a large effective diameter.

Preferably, the fifth and sixth mirrors M5 and M6 are convex and concave mirrors, respectively, for imaging with high NA and maintained back focus.

The catoptric projection optical system 100D does not accord a mirror position with the intermediate image IM surface, reducing aberration that would otherwise occur due to the dust transfers and energy concentrations. Since the catoptric projection-optical system 100D arranges an aperture stop on the second mirror M2, and facilitates an arrangement of the aperture stop. In addition, the catoptric projection optical system 100D arranges all the mirrors between the object surface MS and the image surface W, and facilitates arrangements of mask and wafer stages, etc.

In the catoptric projection optical system 100D, where r1 to r6 are radii of curvature of the first mirror M1 to the sixth mirror M6, Petzval terms indicated in the following Equations 9 and 10 should be nearly zero or preferably zero. While the fifth mirror. M5 is a convex mirror, use of a convex mirror or a plane mirror for other mirrors would have an effect of reducing the sum of Petzval terms, or easily flattening the image surface:

$$\frac{1}{r_1} - \frac{1}{r_2} + \frac{1}{r_3} - \frac{1}{r_4} + \frac{1}{r_5} - \frac{1}{r_6} \approx 0 \qquad (9)$$

$$\frac{1}{r_1} - \frac{1}{r_2} + \frac{1}{r_3} - \frac{1}{r_4} + \frac{1}{r_5} - \frac{1}{r_6} = 0 \qquad (10)$$

Although the catoptric projection optical system 100D includes six mirrors, it needs at least one or more aspheric mirrors. A shape of the aspheric surface is defined as Equation 2 as an equation of a generic aspheric surface. However, as a mirror having an aspheric surface advantageously facilitates a correction of aberration, the aspheric surface is preferably applied to many possible (desirably, sixth) mirrors.

A multilayer coating for reflecting the EUV light is applied onto a surface of each of the first to sixth mirrors M1 to M6, and serves to enhance the light. A multilayer coating that can reflect the EUV light having a wavelength of 20 nm or smaller can include, for example, a Mo/Si multilayer coating including alternately laminated molybdenum (Mo) and silicon (Si) layers or a Mo/Be multilayer coating including alternately laminating molybdenum (Mo) and beryllium (Be) layers. An optimal material is selected according to wavelengths to be used. Of course, the present invention does not limit the multilayer coating to the above materials, and may use any multilayer coating that has an operation or effect similar to that of the above.

A description will now be given of illumination experiment results using the catoptric projection optical systems 100D to 100G. In FIGS. 6 to 9, MS is a reflection mask located at the object surface, and W is a wafer located at the image surface.

The catoptric projection optical systems 100D to 100G illuminate the mask MS using an illumination system (not shown) for emitting the EUV light with a wavelength of about 13.4 nm, and reflect the reflected EUV light from the mask MS via the first (convex or plane) mirror M1, the second (concave) mirror M2, the third (convex or plane) mirror M3, the fourth (concave) mirror M4, the fifth (convex) mirror M5, and the sixth (concave) mirror in this order. Then, a reduced image of the mask pattern is formed on the wafer W located at the image surface.

The catoptric projection optical systems 100D to 100G form an intermediate image IM between the second mirror M2 and the fourth mirror M4, which is in turn re-imaged on the wafer W by the remaining mirrors.

A position of the intermediate image IM and the surface shapes of the first and third mirrors M1 and M3 have possible variations: The catoptric projection optical system 100D uses a convex mirror for the first mirror, and a plane mirror for the third mirror, and forms the intermediate image IM between the second mirror M2 and the third mirror M3. The catoptric projection optical system 100E uses convex mirrors for the first and third mirrors, and forms the intermediate image IM between the second mirror M2 and the third mirror M3. The catoptric projection optical system 100F uses convex mirrors for the first and third mirrors, and forms the intermediate image IM between the third mirror M3 and the fourth mirror M4. The catoptric projection optical system 100G uses plane mirrors for the first and third mirrors, and forms the intermediate image IM between the second mirror M2 and the third mirror M3.

The catoptric projection optical system 100D has a numerical aperture at the image side NA=0.24, a reduction=1/4, an object point of 128 to 136 mm, and an arc-shaped image fieldwith a width of 8 mm. Table 5 indicates the numerical values (such as radius of curvature, surface intervals, and coefficients of aspheric surfaces) of the catoptric projection optical system 100D.

being distant from the optical axis. As a result, the maximum effective diameter is very small, such as about 430 mm, and advantageously facilitates processing and measurements. In reflecting the light around the optical axis, the light shielding on the sixth mirror M6 possibly becomes an issue. However, the catoptric projection optical system 100D prevents this problem by forming the intermediate image IM between the second and third mirrors M2 and M3.

The catoptric projection optical system 100D has a span of 933 mm, and reduces the mirrors' effective diameters. Therefore, the catoptric projection optical system 100D can reduce a size of a mirror barrel that accommodates the catoptric projection optical system 100D. Since the EUV light is easily absorbed in the air, it is necessary to draw a vacuum in the mirror barrel. The mirror barrel has a small capacity, and easily maintained highly vacuum. As a result, an absorptive loss of the EUV light can be reduced.

Table 6 shows characteristics of an incident angle of light upon each mirror for NA=0.25.

TABLE 5

| MIRROR NUMBERS | RADII OF CURVATURE (mm) | SURFACE INTERVALS (mm) |
|---|---|---|
| MS(MASK) | ∞ | 491.891136 |
| M1 | 3842.26663 | −391.89136 |
| M2 | 632.52970 | 782.33141 |
| M3 | ∞ | −340.56806 |
| M4 | 587.99023 | 347.08332 |
| M5 | 179.04357 | −296.95531 |
| M6 | 384.58260 | 340.95531 |
| W(WAFRR) | ∞ | |

| ASPHERIC COEFFICIENTS | K | A | B |
|---|---|---|---|
| M1 | −267.466169315 | −0.780043944305e−8 | 0.413260127269e−12 |
| M2 | −2.62843602129 | 0.171126503969e−8 | −0.104963421095e−13 |
| M3 | 0 | −0.181104227812e−8 | 0.35455238427e−13 |
| M4 | −0.501489651051 | −0.499638591354e−10 | 0.551481326761e−15 |
| M5 | 0.652185965963 | 0.128818331391e−7 | −0.122530514853e−11 |
| M6 | 0.0422385684211 | 0.631614287722e−10 | 0.118302622927e−14 |

| | C | D | E |
|---|---|---|---|
| M1 | 0.821037737439e−16 | −0.2002546922e−19 | 0.34695910542e−23 |
| M2 | 0.216367766343e−18 | −0.705067342902e−21 | 0.459327058535e−24 |
| M3 | −0.65672698442e−18 | 0.252500625965e−22 | −0.293865288006e−27 |
| M4 | 0.621448231393e−19 | −0.685646752963e−24 | −0.54845472391e−29 |
| M5 | 0.12745886225e−15 | 0.157924483326e−18 | −0.265980125498e−21 |
| M6 | 0.263860018168e−19 | −0.553148373653e−23 | 0.953035608666e−27 |

Aberration that does not include manufacture errors in the catoptric projection optical system 100D is wave front aberration of 55 mλrms, and static distortion of 2 nmPV.

The catoptric projection optical system 100D makes the first mirror M1 of a convex mirror, reduces an angle between an optical axis and exit light from the first mirror M1, and enables the light to be reflected around the optical axis. In addition, the catoptric projection optical system 100D intersects the light incident upon the third mirror M3 from the second mirror M2 and the light incident upon the fifth mirror M5 from the fourth mirror M4, preventing the light from

TABLE 6

| MIRROR NUMBERS | MAXIMUM VALUES | MINIMUM VALUES | DISTRIBUTIONS |
|---|---|---|---|
| M1 | 12.06° | 4.26° | 8.34° |
| M2 | 9.15° | 6.22° | 2.93° |
| M3 | 14.07° | 0.58° | 13.49° |
| M4 | 7.68° | 6.64° | 1.03 |
| M5 | 17.95° | 13.08° | 4.88° |
| M6 | 6.42° | 3.03° | 3.39° |

Referring to Table 6, a maximum value of an incident angle upon the fifth mirror M5 is reduced down. An incident angle distribution becomes very small since a convergent pencil of rays is incident upon the fifth mirror M5. Thereby, deteriorated reflective performance is reduced when a multilayer coating is applied to the fifth mirror M5. A maximum value of an incident angle upon the third mirror M3 is small, such as 14°, and the deteriorated reflective performance is reduced even for a large incident angle distribution. Thus, a mirror that has a large incident angle has a small incident angle distribution, and a mirror that has a large incident angle distribution has a reduced maximum incident angle. As a result, the deteriorated reflective performance is reduced.

The catoptric projection optical system 100E has a numerical aperture at the image side NA=0.2, a reduction=1/4, an object point of 158 to 162 mm, and an arc-shaped image field with a width of 4 mm. Table 7 indicates the numerical values (such as radius of curvature, surface intervals, and coefficients of aspheric surfaces) of the catoptric projection optical system 100E.

The catoptric projection optical system 100E makes the first mirror M1 of a convex mirror, and reduces an angle between an optical axis and exit light from the first mirror M1, making a maximum effective diameter very small, such as 364 mm. When an angle between the optical angle and the light is reduced, it is necessary to avoid interference between the light and the sixth mirror M6 having a large effective diameter. The catoptric projection optical system 100E prevents this problem by forming the intermediate image IM just after the second mirror M2.

The catoptric projection optical system 100F has a numerical aperture at the image side NA=0.25, a reduction=1/4, an object point of 122 to 130 mm, and an arc-shaped image field with a width of 8 mm. Table 8 indicates

TABLE 7

| MIRROR NUMBERS | RADII OF CURVATURE (mm) | SURFACE INTERVALS (mm) |
|---|---|---|
| MS(MASK) | ∞ | 658.26146 |
| M1 | 214879359.15 | −532.96340 |
| M2 | 968.52493 | 887.02991 |
| M3 | 302.21545 | −76.29295 |
| M4 | 302.88700 | 433.45625 |
| M5 | 279.79415 | −475.79348 |
| M6 | 557.57332 | 519.793497 |
| W(WAFRR) | ∞ | |

| ASPHERIC COEFFICIENTS | K | A | B |
|---|---|---|---|
| M1 | 7886200465.33 | 0.998467744129e−9 | 0.276929625357e−13 |
| M2 | 0.576057838374 | 0.720732006484e−10 | −0.405947850963e−14 |
| M3 | 0.178388569845 | −0.154480713934e−7 | 0.676524919146e−13 |
| M4 | −0.10820753647 | −0.176253797839e−9 | −0.318388453182e−13 |
| M5 | 0.859902280036 | 0.10000001006e−7 | −0.451956204989e−12 |
| M6 | 0.200673795638 | 0.15913155059e−10 | 0.123333352382e−15 |

| | C | D | E |
|---|---|---|---|
| M1 | −0.819354130577e−18 | 0.422974905745e−22 | 0.812933052576e−27 |
| M2 | 0.232860996913e−17 | −0.14272438678e−20 | 0.469820803993e−24 |
| M3 | −0.259281087434e−17 | 0.452461465117e−21 | −0.108110050172e−25 |
| M4 | 0.947732778352e−18 | −0.885220695317e−23 | −0.422778758118e−28 |
| M5 | 0.213913267533e−15 | −0.130190193938e−18 | 0.466866777368e−22 |
| M6 | 0.295497686531e−20 | −0.2101517413e−24 | 0.106110486037e−28 |

Aberration that does not include manufacture errors in the catoptric projection optical system 100E is wave front aberration of 56 mλrms, and static distortion of 11 nmPV.

the numerical values (such as radius of curvature, surface intervals, and coefficients of aspheric surfaces) of the catoptric projection optical system 100F.

TABLE 8

| MIRROR NUMBERS | RADII OF CURVATURE (mm) | SURFACE INTERVALS (mm) |
|---|---|---|
| MS(MASK) | ∞ | 630.63097 |
| M1 | 213201.57945 | −417.771265833 |
| M2 | 939.120114495 | 793.106767987 |
| M3 | 520.907316756 | −229.107168 |
| M4 | 527.437807758 | 629.107168382 |
| M5 | 278.238429882 | −300.03353522 |
| M6 | 379.140529712 | 344.03353337 |

TABLE 8-continued

| W(WAFRR) | ∞ | | |
|---|---|---|---|
| ASPHERIC COEFFICIENTS | K | A | B |
| M1 | −0.130157377373e−16 | 0.294884222921e−8 | −0.504891287517e−13 |
| M2 | 0.221764262896 | 0.338836135218e−10 | 0.179320145127e−14 |
| M3 | −1.23095363021 | 0.199723811283e−8 | 0.731860205179e−13 |
| M4 | 0.102083746494 | 0.145341685209e−9 | −0.331143102209e−14 |
| M5 | 0.342344307508 | −0.250288875581e−9 | 0.17035708683e−11 |
| M6 | 0.0337680257497 | 0.841651491226e−10 | 0.743992701748e−15 |
| | C | D | E |
| M1 | 0.262404635386e−17 | −0.430097153156e−21 | 0.55918794348e−25 |
| M2 | −0.598648148177e−18 | 0.295381657598e−21 | −0.790697391742e−25 |
| M3 | 0.264647042188e−17 | −0.249721825751e−21 | −0.50372600864e−25 |
| M4 | 0.349555763031e−19 | 0.248164304097e−23 | −0.819476409776e−28 |
| M5 | −0.286921460603e−15 | 0.3225090808e−18 | −0.20095213655e−21 |
| M6 | 0.927532130967e−20 | −0.254407910898e−24 | 0.155462277452e−28 |

Aberration that does not include manufacture errors in the catoptric projection optical system 100F is wave front aberration of 31 mλrms, and static distortion of 6 nmPV.

The catoptric projection optical system 100F makes the first mirror M1 of a convex mirror, and reduces an angle between an optical axis and exit light from the first mirror M1. While the fourth mirror M4 determines the maximum effective diameter, the intermediate image formed between the third and fourth mirrors M3 and M4 restrains the expansion of the fourth mirror M4. Thereby, the maximum effective diameter becomes very small, such as 420 mm. In addition, the catoptric projection optical system 100F restrains the expansion of the third mirror M3 that tends to be located at a position congested with light, and facilitates an arrangement of the third mirror M3.

Due to small expansions of the third and fourth mirrors M3 and M4, these mirrors have small aspheric amounts, such as 4.06 μm and 4.53 μm, respectively. The small effective diameter and aspheric amount facilitate processing and measurements.

The catoptric projection optical system 100G has a numerical aperture at the image side NA=0.25, a reduction=1/4, an object point of 126 to 130 mm, and an arc-shaped image field with a width of 4 mm. Table 8 indicates the numerical values (such as radius of curvature, surface intervals, and coefficients of aspheric surfaces) of the catoptric projection optical system 100G.

TABLE 9

| MIRROR NUMBERS | RADII OF CURVATURE (mm) | SURFACE INTERVALS (mm) |
|---|---|---|
| MS (MASK) | ∞ | 630.39040422 |
| M1 | ∞ | −414.889111869 |
| M2 | 986.30700 | 1145.14669637 |
| M3 | ∞ | −455.621212317 |
| M4 | 919.99906 | 575.973223593 |
| M5 | 241.54161 | −385.799698492 |
| M6 | 472.69959 | 429.799698492 |
| W (WAFRR) | ∞ | |

| ASPHERIC COEFFICIENTS | K | A | B |
|---|---|---|---|
| M1 | 0.0 | 0.392913766692e−8 | −0.482700852306e−13 |
| M2 | 5.71467204258 | −0.74423961703e−9 | −0.218940230513e−14 |
| M3 | 0.0 | 0.117641302987e−9 | 0.437846210229e−13 |
| M4 | 0.262054559486 | 0.102681269079e−9 | 0.402913796893e−15 |
| M5 | −0.133399664252 | 0.114059493627e−8 | 0.570575209799e−12 |
| M6 | 0.029253097984 | 0.419098009587e−10 | 0.284038877645e−15 |
| | C | D | E |
| M1 | 0.85841732904e−18 | −0.573601920195e−22 | −0.302379564719e−26 |
| M2 | −0.164265249949e−17 | 0.123119917367e−20 | −0.563252413767e−24 |
| M3 | −0.209910470364e−17 | 0.274183093663e−22 | 0.515594464729e−27 |
| M4 | −0.117081986791e−19 | 0.324154600714e−24 | −0.374245169062e−29 |
| M5 | −0.859772349117e−16 | 0.160541027121e−18 | −0.162675556918e−21 |
| M6 | −0.927844388002e−22 | 0.334753349725e−24 | −0.39683041798e−28 |

Aberration that does not include manufacture errors in the catoptric projection optical system 100G is wave front aberration of 21 mλrms, and static distortion of 2 nmPV.

The catoptric projection optical system 100G makes the first mirror M1 of a plane mirror, reduces an angle between an optical axis and exit light from the first mirror M1, and enables the light to be reflected around the optical axis. In addition, the catoptric projection optical system 100G intersects the light incident upon the third mirror M3 from the second mirror M2 and the light incident upon the fifth mirror MS from the fourth mirror M4, preventing the light from being distant from the optical axis. As a result, the maximum effective diameter is very small, such as about 464 mm, and advantageously facilitates processing and measurements. In reflecting the light around the optical axis, the light shielding on the sixth mirror M6 possibly becomes an issue. However, the catoptric projection optical system 100G prevents this problem by forming the intermediate image IM between the second and third mirrors M2 and M3.

Table 10 shows characteristics of an incident angle of light upon each mirror for NA=0.25.

TABLE 10

| MIRROR NUMBERS | MAXIMUM VALUES | MINIMUM VALUES | DISTRIBUTIONS |
|---|---|---|---|
| M1 | 10.97° | 2.93° | 8.04° |
| M2 | 6.96° | 6.49° | 0.47° |
| M3 | 11.24° | 2.74° | 8.50° |
| M4 | 6.29° | 3.61° | 2.68° |
| M5 | 18.10° | 7.13° | 11.0° |
| M6 | 5.05° | 2.31° | 2.74° |

Referring to Table 10, a convergent pencil of rays is incident upon the fifth mirror MS and an incident angle distribution is reduced at the fifth mirror MS as well as the third mirror M3. The fifth mirror MS has the paraxial magnification of −0.15, and an angle with a marginal ray is 3.3° for NA of 0.25 in the catoptric projection optical system 100G.

Thus, the catoptric projection optical systems 100D to 100G make the first mirror M1 of a convex or plane mirror, and form an intermediate image IM between the second and fourth mirrors M2 and M4, to realize an optical system with a reduced effective diameter and a small apparatus, and facilitate easy processing and measurements.

Figure 10:
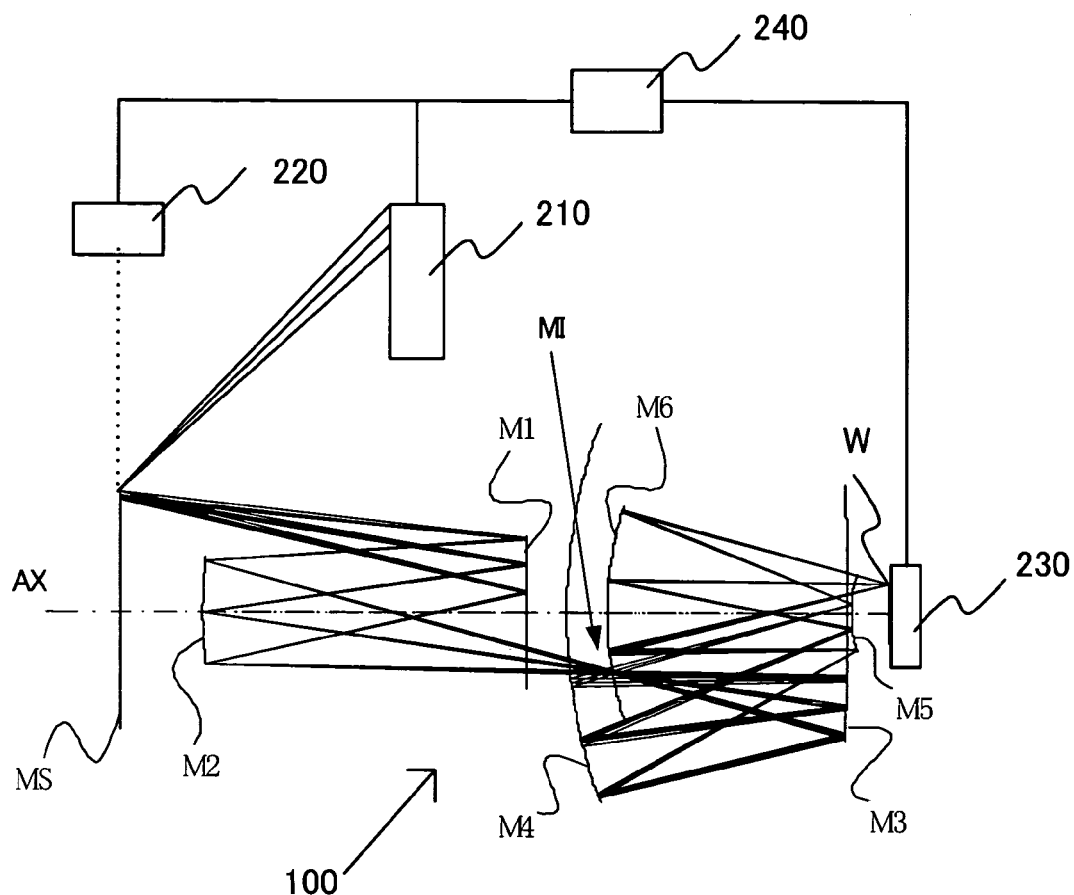
FIG. 10 is a schematic structure of an exposure apparatus as one aspect according to the present invention.

Referring now to FIG. 10, a description will now be given of the exposure apparatus 200. FIG. 10 is a schematic structure of the exposure apparatus 200. The exposure apparatus 200 is a projection exposure apparatus that uses the EUV light (with a wavelength of, e.g., 13.4 nm) as illumination light for exposure, and provides a step-and-scan exposure.

The exposure apparatus 200 includes, as shown in FIG. 10, an illumination apparatus 210, a mask MS, a mask stage 220 mounted with the mask MS, a catoptric projection optical system 100, an object W, a wafer stage 230 mounted with the object W, and a controller 240. The controller 240 is connected controllably to the illumination apparatus 210, the mask stage 220 and the wafer stage 230.

At least the optical path through which the EUV light travels should preferably be maintained in a vacuum atmosphere, although not shown in FIG. 10, since the EUV light has low transmittance for air. In FIG. 10, XYZ defines a three-dimensional space, and the direction Z is a normal direction to the XY plane.

The illumination apparatus 210 uses circular EUV light (with a wavelength of, for example, 13.4 nm) corresponding to a circular field of the reflection type projection optical system, to illuminate the mask MS, and includes a light source and illumination optical system (not shown). The illumination apparatus 210 may use any technology known in the art for the light source and illumination optical system, and a detailed description thereof will be omitted. For example, the illumination optical system may include a condenser optical system, an optical integrator, an aperture stop, a blade, etc., and use any technique conceivable to those skilled in the art.

The mask MS is a reflection or transmission mask, and forms a circuit pattern (or image) to be transferred. It is supported and driven by a mask stage 220. The diffracted light emitted from the mask MS is projected onto the object W after reflected by the projection optical system 100. The mask MS and object W are arranged optically conjugate with each other. Since the exposure apparatus 200 is a step-and-scan exposure apparatus, the mask MS and object W are scanned to transfer the pattern on the mask MS, onto the object W.

The mask stage 220 supports the mask MS and is connected to a mobile mechanism (not shown). The mask stage 220 may use any structure known in the art. The mobile mechanism (not show) may use a linear motor, etc., and drives the mask stage 220 in the direction Y so as to move the mask MS under control by the controller 240. The exposure apparatus 200 scans while synchronizes the mask MS and object W through the controller 240.

Figure 11:
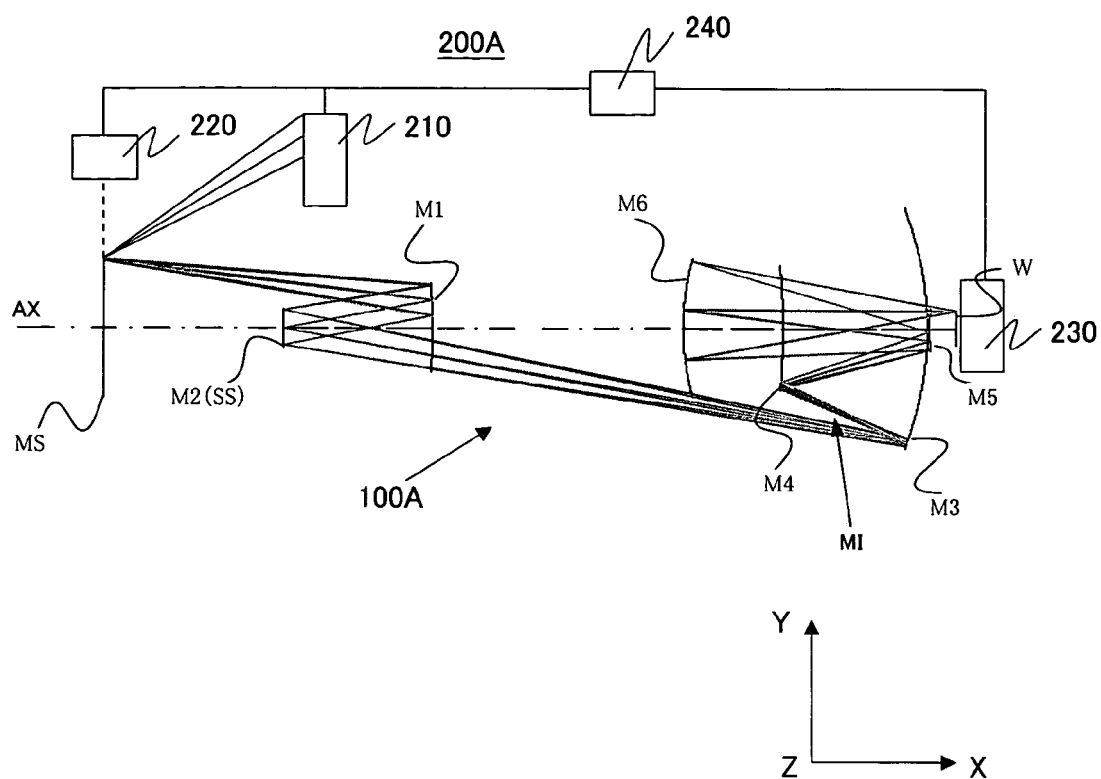
FIG. 11 is a schematic structure of an exposure apparatus as another aspect according to the present invention.
Figure 12:
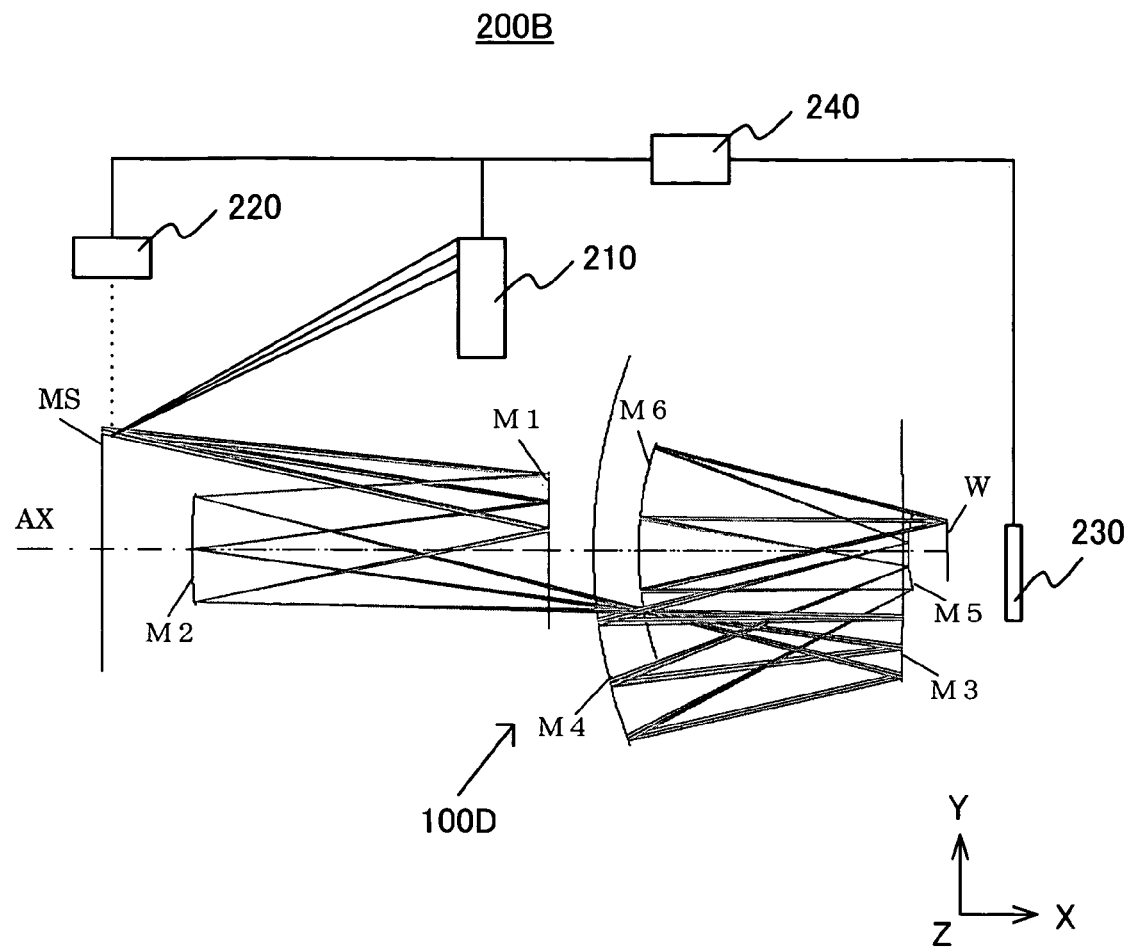
FIG. 12 is a schematic structure of an exposure apparatus as still another aspect according to the present invention.

The catoptric projection optical system 100 is an optical system that reduces and projects a pattern on the mask MS onto the image surface. The reflection type projection optical system 100 may use any of the above embodiments, and a detailed description thereof will be omitted. Although FIG. 10 uses the reflection type optical system 100 shown in FIG. 1, the present invention is not limited to this illustrative embodiment, and the exposure apparatus 200 can use the reflection type optical system 100A, etc. FIG. 11 shows a schematic structure of an exposure apparatus 200A that includes the reflection type optical system 100A, and FIG. 12 shows a schematic structure of an exposure apparatus 200B that includes the reflection type optical system 100D.

The object W is a wafer in this embodiment, but may be a LCD and another object to be exposed. Photoresist is applied to the object W.

The object W is supported by the wafer stage 230. For example, the wafer stage 230 uses a linear motor to move the object W in XYZ directions. The mask MS and object W are, for example, scanned synchronously under control by the controller 240, and the positions of the mask stage 220 and wafer stage 230 are monitored, for example, by a laser interferometer and the like, so that both are driven at a constant speed ratio.

The controller 240 includes a CPU and memory (not shown) and controls operations of the exposure apparatus 200. The controller 240 is electrically connected to (a mobile mechanism (not shown) for) the mask stage 220, and (a mobile mechanism (not shown) for) the wafer stage 230. The CPU includes a processor regardless of its name, such as an MPU, and controls each module. The memory includes a ROM and RAM, and stores a firmware for controlling the operations of the exposure apparatus 200.

In exposure, the EUV light emitted from the illumination apparatus 210 illuminates the mask MS, and the pattern on the mask MS onto the object W. The instant embodiment provides a circular or ring-shaped image surface, and scans the entire surface on the mask MS by scanning the mask MS and object W with a speed ratio corresponding to the reduction ratio.

Figure 13:
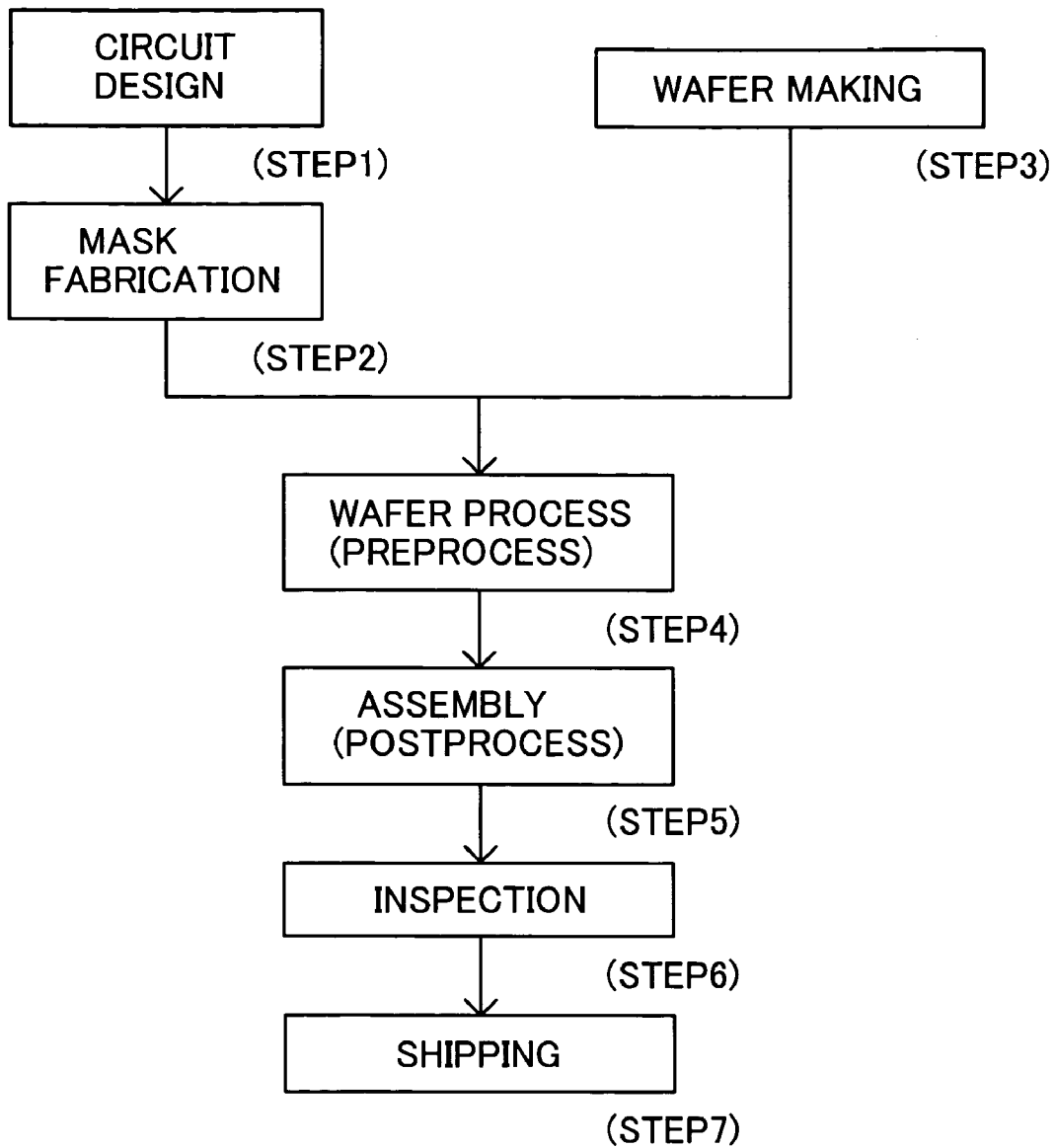
FIG. 13 is a flowchart for explaining a method for fabricating devices (semiconductor chips such as ICs, LSIs, and the like, LCDs, CCDs, etc.).
Figure 14:
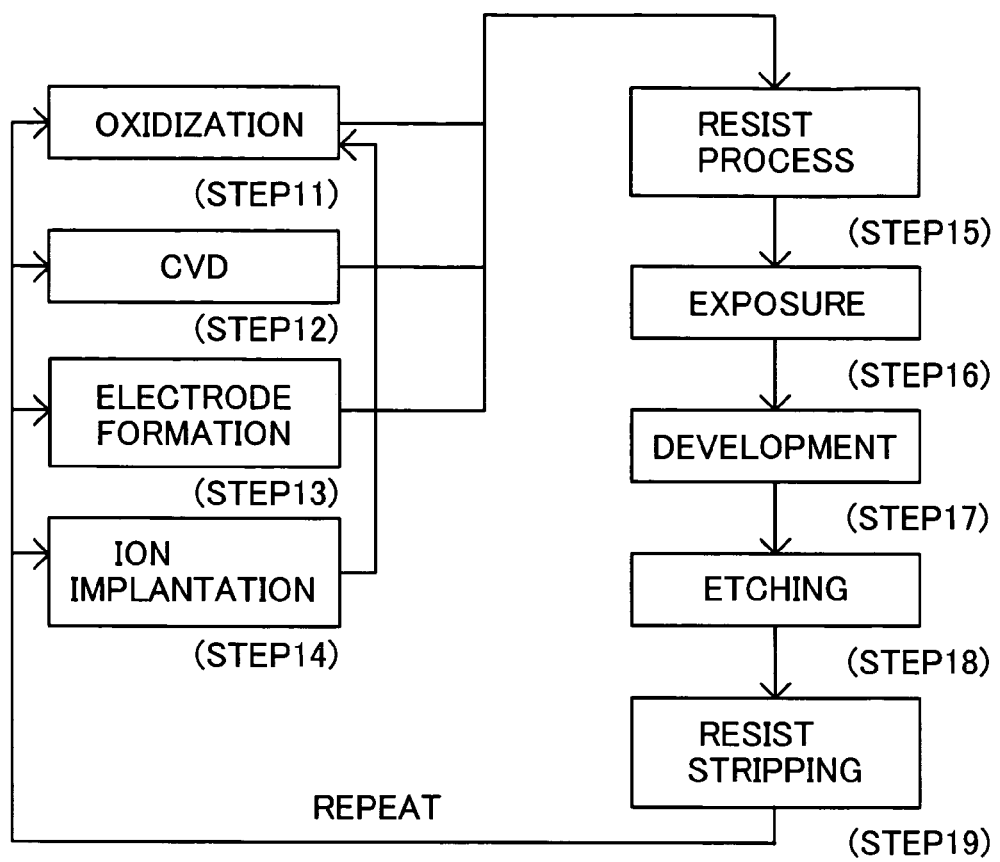
FIG. 14 is a detailed flowchart for Step 4 of wafer process shown in FIG. 4.

Referring to FIGS. 13 and 14, a description will now be given of an embodiment of a device fabricating method using the above mentioned exposure apparatus 200. FIG. 13 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials-such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 14 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, the device fabrication method using the exposure apparatus 200, and the devices as finished goods also constitute one aspect of the present invention.

Further, the present invention is not limited to these-preferred embodiments, and various variations and modifications may be made without departing from the scope of the present invention. For example, the reflection type projection optical system of this embodiment has a coaxial system having a rotationally symmetrical aspheric surface, but it may have a rotationally asymmetrical aspheric surface. The present invention is applicable a reflection type projection optical system for non-EUV ultraviolet light with a wavelength of 200 nm or less, such as ArF excimer laser and $F_2$ excimer laser, as well as to an exposure apparatus that scans and exposes a large screen, or that exposes without scanning.

Thus, the present invention can provide a six-mirror catoptric projection optical system with a high NA and excellent imaging performance, and an exposure apparatus using the same, which are applicable to the EUV lithography, and reduce a maximum effective diameter and a span of the optical system and/or maintain spaces for a stage mechanism, a mirror holder, etc. as well as preventing light-shielding on the final reflective surface.

What is claimed is:

1. A catoptric projection optical system for projecting a reduced size of a pattern on an object surface onto an image surface, said catoptric projection optical system comprising six mirrors that include a first convex mirror, a second minor, a third mirror, a fourth mirror, a fifth mirror, and a sixth mirror in order of reflections of light,
   wherein the light incident upon the third mirror from the second mirror intersects with the light incident upon the fifth mirror from the fourth mirror.

2. A catoptric projection system according to claim 1, said catoptric projection system forms an intermediate image between the second mirror and the third mirror on an optical path.

3. A catoptric projection optical system according to claim 1, wherein the second mirror is located at a position of an aperture stop.

4. A catoptric projection optical system according to claim 1, wherein the numerical aperture is greater than 0.2.

5. A catoptric projection optical system according to claim 1, wherein the six mirrors form a coaxial system.

6. A catoptric projection optical system according to claim 1, wherein at least one of the six mirrors are aspheric mirrors including a multilayer coating that reflect light having a wavelength of 20 nm or smaller.

7. A catoptric projection optical system according to claim 1, wherein all of the six mirrors are aspheric mirrors including a multilayer coating that reflect light having a wavelength of 20 nm or smaller.

8. A catoptric projection optical system according to claim 1, wherein the light has a wavelength of 20 nm or smaller.

9. A catoptric projection optical system according to claim 1, wherein said catoptric projection optical system is telecentric at a side of the image surface.

10. A catoptric projection optical system according to claim 1, wherein a reflection mask is arranged on the object surface.

11. An exposure apparatus comprising:
    an illumination optical system for illuminating a pattern of a mask with light from a light source; and
    a catoptric projection optical system for projecting a reduced size of the pattern on an object surface onto an image surface, said catoptric projection optical system comprising six mirrors that include a first convex mirror, a second mirror, a third mirror, a fourth mirror, a fifth minor, and a sixth mirror in order of reflections of light, wherein the light incident upon the third mirror from the second mirror intersects with the light incident upon the fifth mirror from the fourth mirror.

12. A device fabricating method comprising the steps of:
    exposing an object using an exposure apparatus; and
    developing the object that has been exposed,
    wherein said exposure apparatus includes:
    an illumination optical system for illuminating a pattern of a mask with light from a light source; and
    a catoptric projection optical system for projecting a reduced size of the pattern on the object surface onto an image surface, said catoptric projection optical system comprising six mirrors that include a first convex mirror, a second mirror, a third mirror, a fourth mirror, a fifth mirror, and a sixth mirror in order of reflections of light, wherein the light incident upon the third mirror from the second mirror intersects with the light incident upon the fifth mirror from the fourth mirror.

* * * * *

UNITED STATES PATENT AND TRADEMARK OFFICE
CERTIFICATE OF CORRECTION

| | | |
|---|---|---|
| PATENT NO. | : 7,154,586 B2 | Page 1 of 1 |
| APPLICATION NO. | : 10/785288 | |
| DATED | : December 26, 2006 | |
| INVENTOR(S) | : Koshi Hatakeyama, Toshihiro Sunaga and Takahiro Sasaki | |

It is certified that error appears in the above-identified patent and that said Letters Patent is hereby corrected as shown below:

Column 2, line 48, "minor" should read --mirror--.

Column 2, line 51, "minor" should read --mirror--.

Column 2, line 54, "minor" should read --mirror--.

On the Title page, item (56), the reference corresponding to U.S. Patent No. 6,033,079 should have the class identified as --359--.

On the Title page, item (56), the reference corresponding to U.S. Patent No. "6,922,291 B1" should read --6,922,291 B2--.

On the Title page, item (56), the reference corresponding to foreign patent WO 02/056114 A2 should read --1/2002-- instead of "4/2002" as the issue date.

Column 30, claim 1, line 3, "minor" should read --mirror--.

Column 30, claim 11, line 44, "minor" should read --mirror--.

Signed and Sealed this

Seventh Day of August, 2007

JON W. DUDAS
*Director of the United States Patent and Trademark Office*